(12) United States Patent
Segal et al.

(10) Patent No.: US 6,946,039 B1
(45) Date of Patent: Sep. 20, 2005

(54) PHYSICAL VAPOR DEPOSITION TARGETS, AND METHODS OF FABRICATING METALLIC MATERIALS

(75) Inventors: Vladimir M. Segal, Howell, MI (US); Stephane Ferrasse, Veradale, WA (US); Frank Alford, Veradale, WA (US)

(73) Assignee: Honeywell International Inc., Morristown, NJ (US)

( * ) Notice: Subject to any disclaimer, the term of this patent is extended or adjusted under 35 U.S.C. 154(b) by 269 days.

(21) Appl. No.: 09/705,101

(22) Filed: Nov. 2, 2000

(51) Int. Cl.$^7$ .............................................. C22C 11/00
(52) U.S. Cl. ..................... 148/400; 148/425; 148/426; 148/427; 148/428; 148/429; 148/430; 148/431; 148/432; 148/433; 148/434; 148/435; 148/436; 148/437; 148/438; 148/439; 148/440; 204/298.12; 204/298.13
(58) Field of Search ................................ 148/608, 400, 148/425–440, 689; 204/298.12, 298.13

(56) References Cited

U.S. PATENT DOCUMENTS

| | | | |
|---|---|---|---|
| 5,087,297 A | | 2/1992 | Pouliquen |
| 5,590,389 A | * | 12/1996 | Dunlop et al. ................. 419/66 |
| 5,988,262 A | | 11/1999 | Hasegawa et al. |
| 6,086,725 A | * | 7/2000 | Abburi et al. ............ 204/192.1 |
| 6,139,701 A | * | 10/2000 | Pavate et al. .......... 204/192.12 |
| 6,197,134 B1 | | 3/2001 | Kanzaki et al. |
| 6,238,494 B1 | * | 5/2001 | Segal .......................... 148/421 |

FOREIGN PATENT DOCUMENTS

| | | |
|---|---|---|
| WO | WO 01/94660 A2 | 12/2001 |
| WO | PCT/US01/51010 | 8/2002 |

OTHER PUBLICATIONS

Callister, William D. Jr, "Materials Science and Engineering: An Introduction", 3rd edition, John Wiley and Sons, Inc. (1994), pp. 349–350.
V.M. Segal, "Materials processing by simple shear", Materials Science and Engineering, A197, 1995, pp. 157–164. (The year is sufficiently early so that the month is not in issue.).
F. J. Humphreys et al., "Developing stable fine–grain microstructures by large strain deformation", Phil. Trans. R. Soc. Lond. A. Jun. 15, 1999, vol. 357 #1756, pp. 1663–1681.
S. Ferrasse et al., "Texture evolution during equal channel angular extrusion Part I. Effect of route, number of passes and initial texture", Materials Science and Engineering, vol. 368, Mar. 15, 2004, pp. 28–40.
V.M. Segal. "Equal channel angular extrusion: from macromechanics to structure formation", Materials Science & Engineering A271, Nov. 1, 1999, pp. 322–333.
Rusian Z. Valiev et al., "SPD–Processed Ultra–Fine Grained Ti Materials for Medical Applications", Advanced Materials & Processes, Dec. 2003, pp. 33–34.
Segal et al., "Plastic Working of Metals by Simple Shear", Russian Metall. vol. 1, pp. 99–105, 1991.

(Continued)

Primary Examiner—Sikyin Ip
(74) Attorney, Agent, or Firm—Well St. John P.S.

(57) ABSTRACT

The invention includes a physical vapor deposition target composed of a face centered cubic unit cell metal or alloy and having a uniform grain size less than 30 microns, preferably less than 1 micron; and a uniform axial or planar <220> texture. Also described is a method for making sputtering targets. The method can comprise billet preparation; equal channel angular extrusion with a prescribed route and number of passes; and cross-rolling or forging subsequent to the equal channel angular extrusion.

28 Claims, 14 Drawing Sheets

OTHER PUBLICATIONS

M. Furukawa et al., "Microhardness Measurements and the Hall–Petch Relationship in an Al–Mg Alloy with Submicrometer Grain Size", Acta Mater. vol. 44, No. 11, pp. 4619–4629, 1996.

Yoshinori Iwahashi et al., "Microstructural Characteristics of Ultrafine–Grained Aluminum Produced Using Equal–Channel Angular Pressing", Metallurgical and Materials Transactions vol. 29A, pp. 2245–2252, Sep. 1998.

S. Ferrasse et al., "ECAE Targets with Sub–Micron Grain Structures Improve Sputtering Performance and Cost–of–Ownership", Semiconductor Manufacturing, vol. 4, Issue 10, Oct. 2003, pp. 76–92.

R.Z. Valiev et al., "Bulk Nanostructured materials from severe plastic deformation", Progress in Materials Science, vol. 45, 2000, pp. 103–189.

V. M. Segal et al., "Processes of Plastic Structure Formation", Science and Engineering, 1994, published in Russia, Chapters 1, 3 and 4, with Statement in Accordance with 37 CFR 1.98(a)(3)(i).

Ferrasse et al., "Microstructure and Properties of Copper and Aluminum Alloy 3003 Heavily Worked by Equal Channel Angular Extrusion", Metallurgical and Materials Transactions A. vol. 28A, Apr. 1997, pp. 1047–1057.

\* cited by examiner

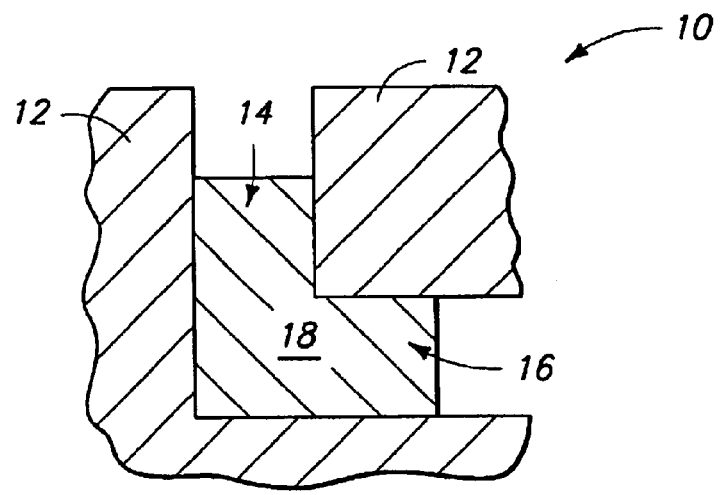
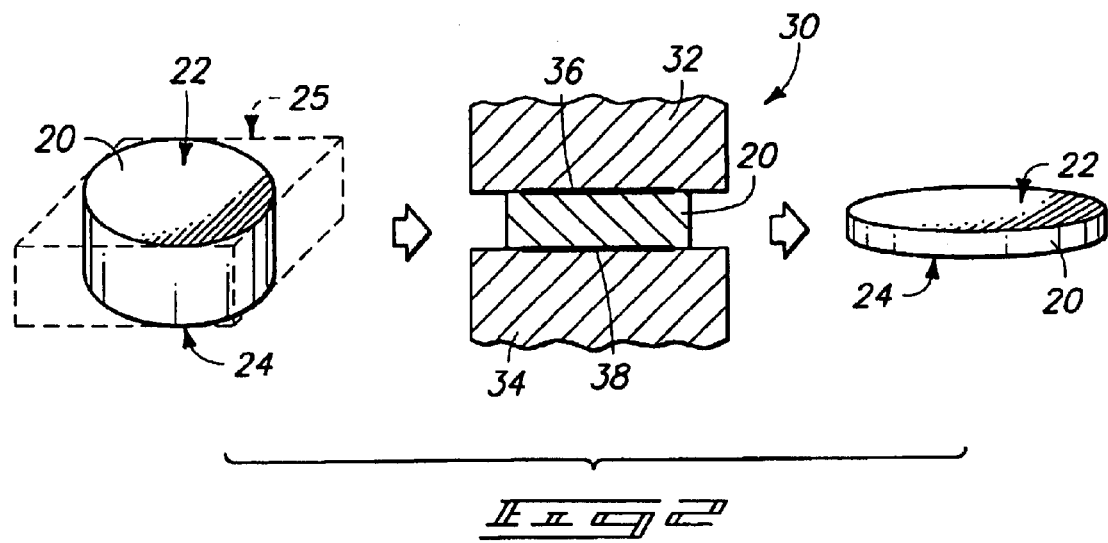

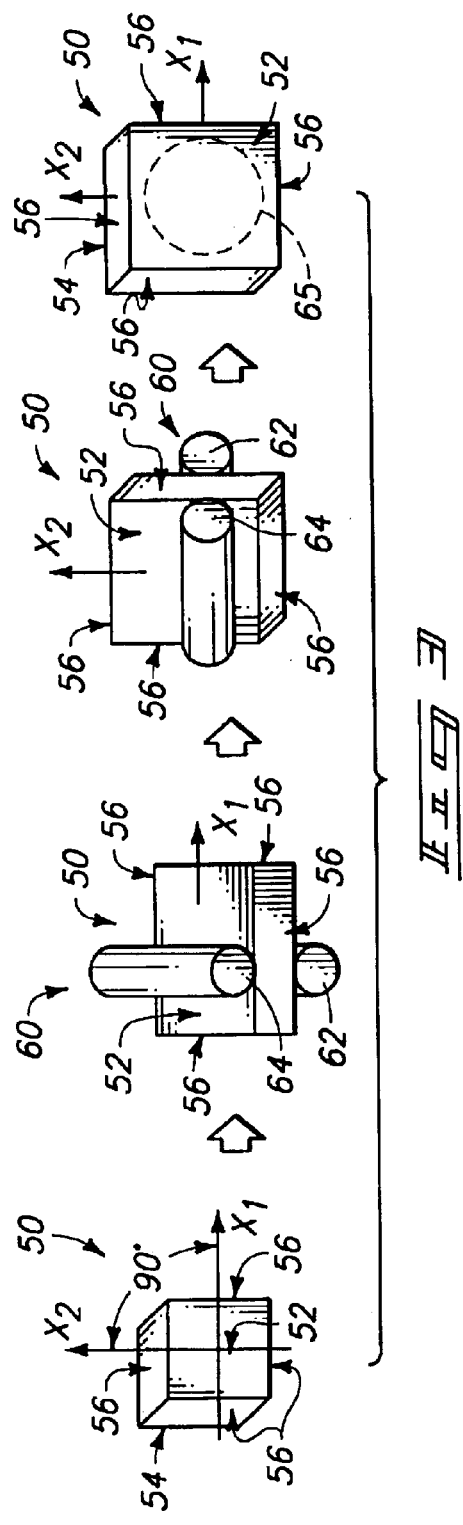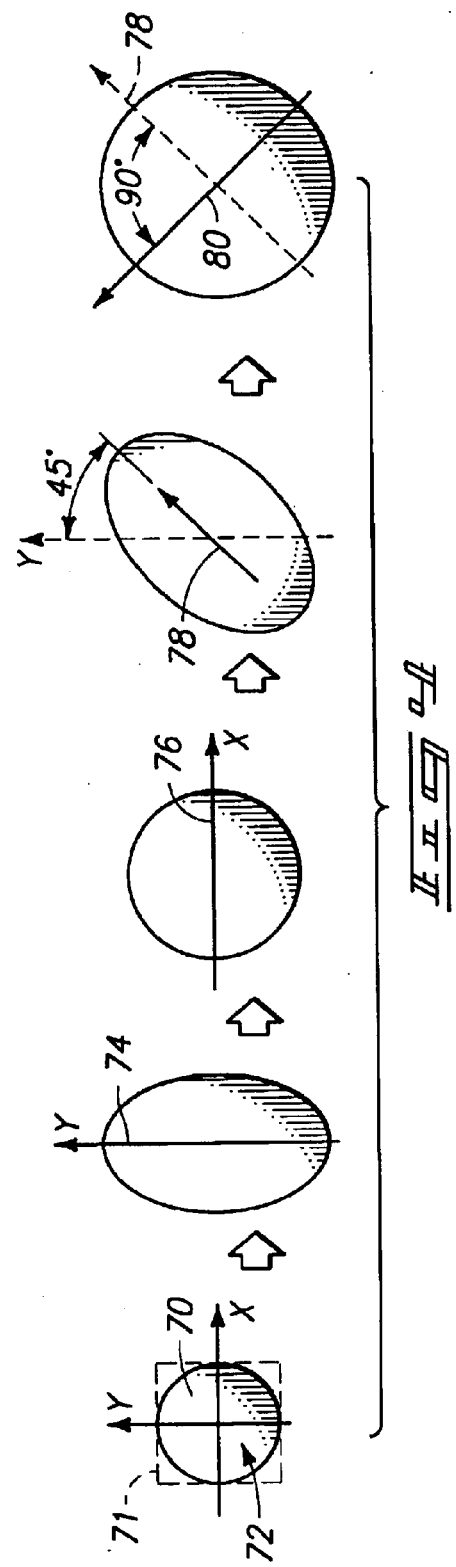

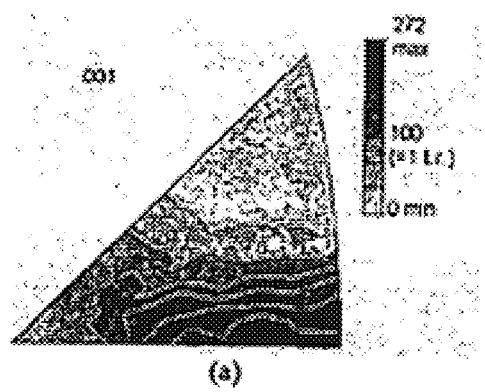
(a)
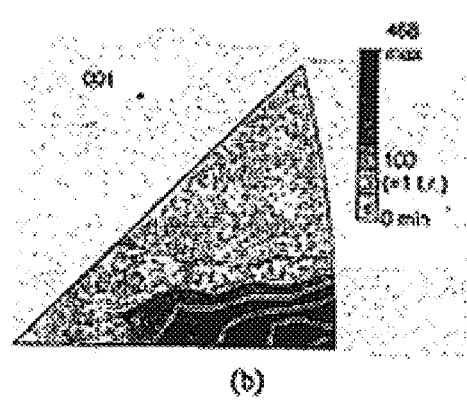
(b)
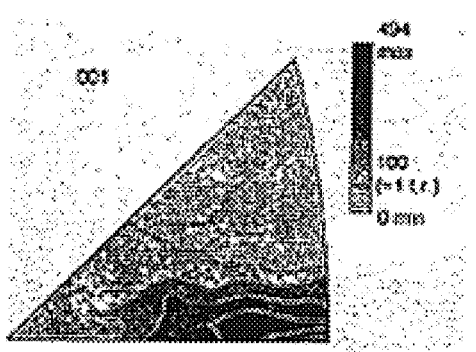
(c)
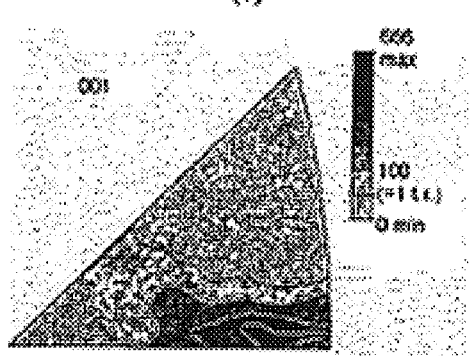
(d)
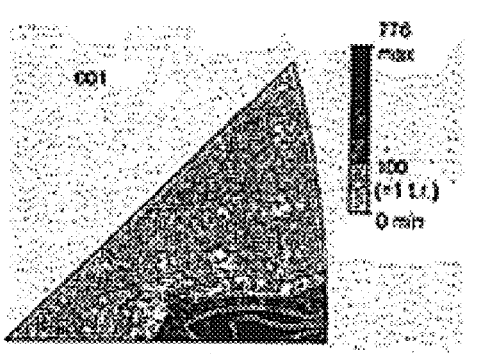
(e)
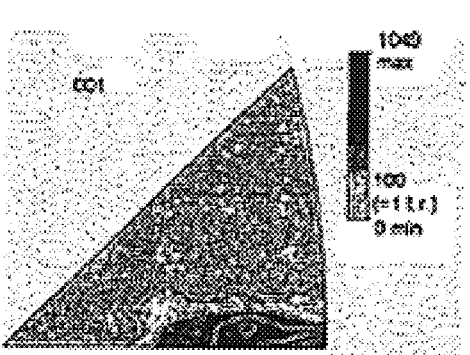
(f)
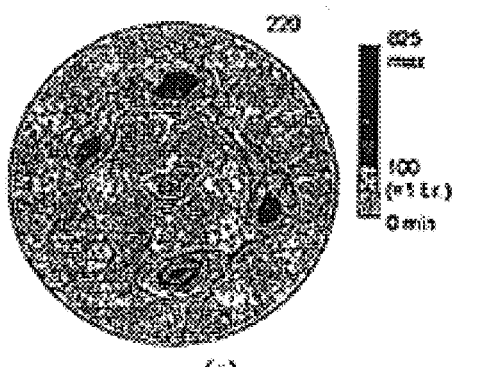
(g)
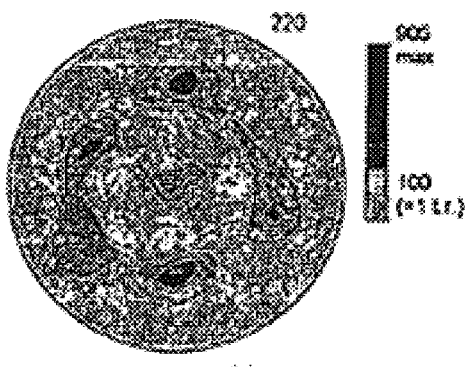
(h)
FIG. 5

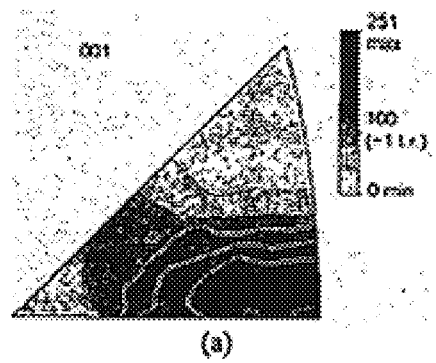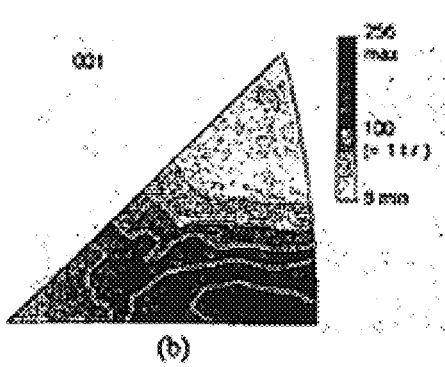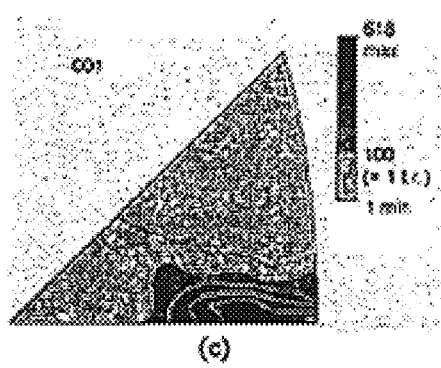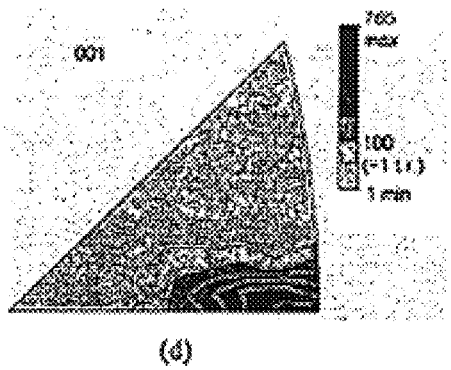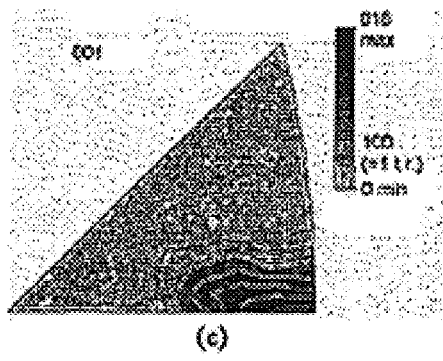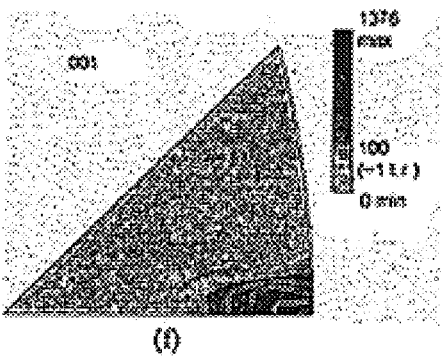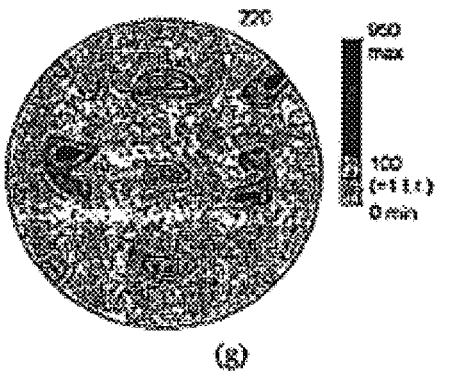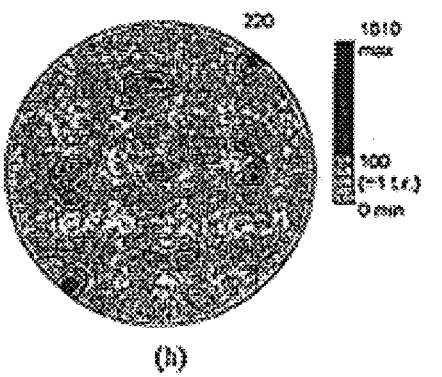
FIG. 8

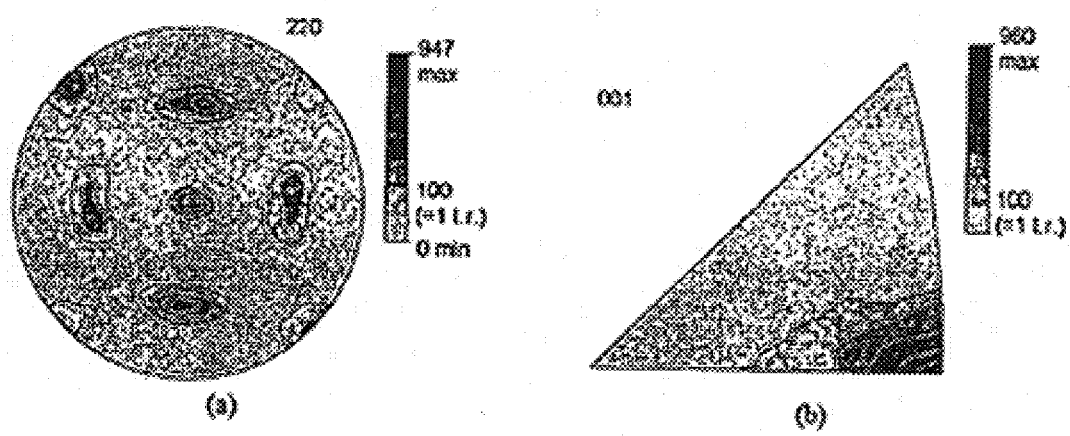
FIG. 10
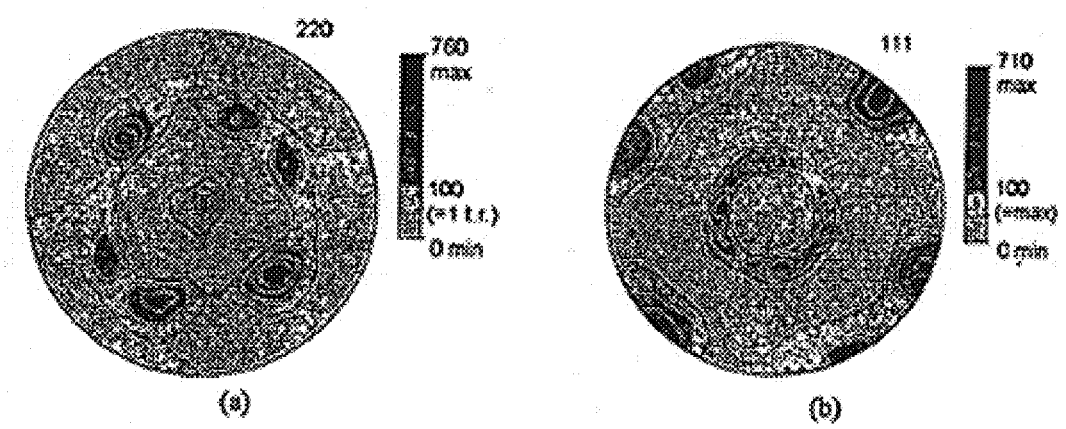
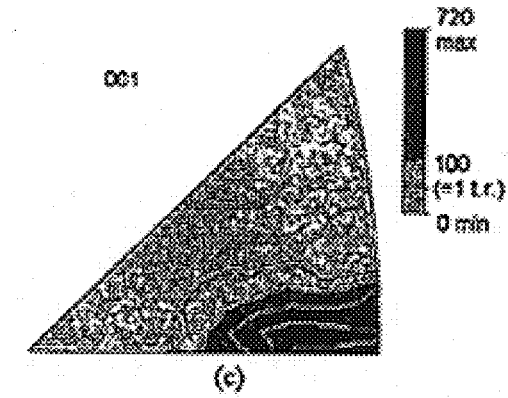
FIG. 11

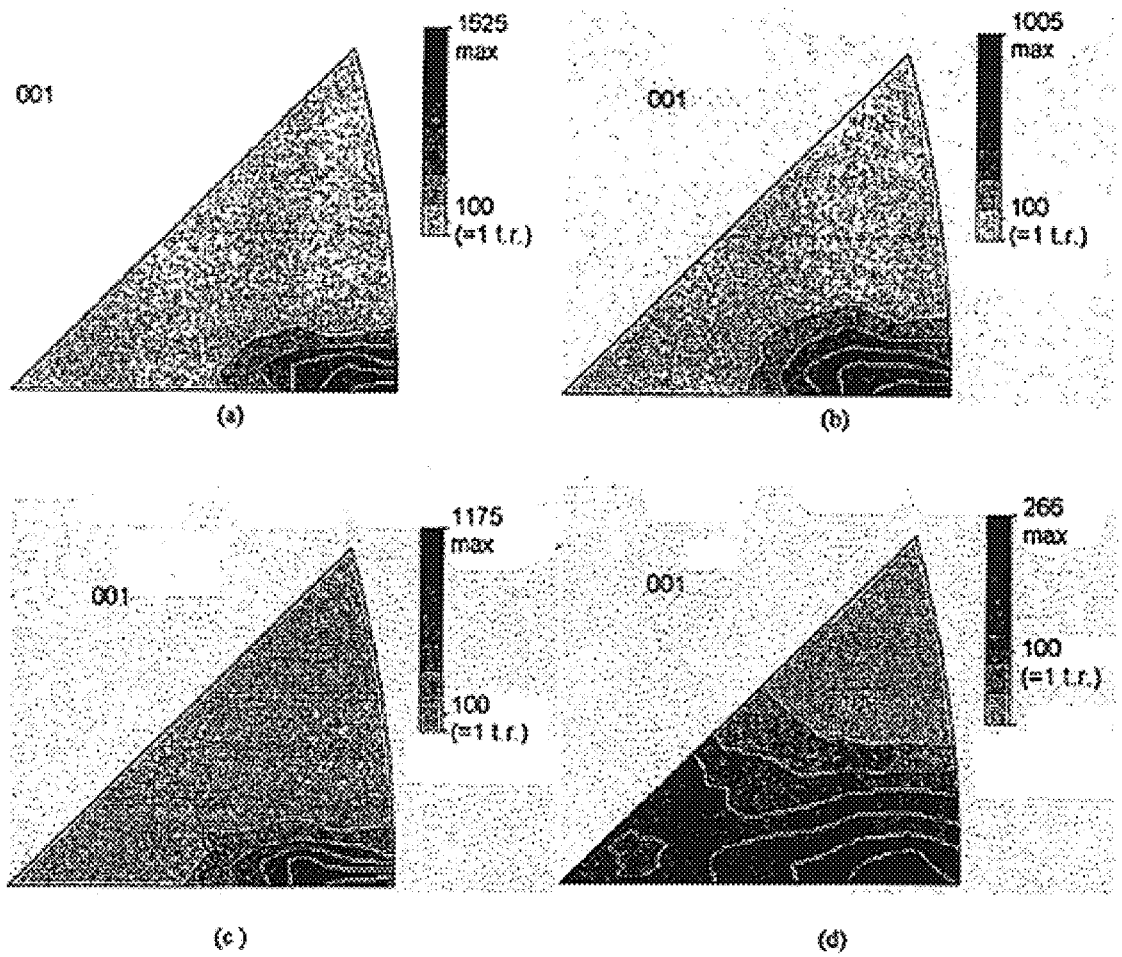

PHYSICAL VAPOR DEPOSITION TARGETS, AND METHODS OF FABRICATING METALLIC MATERIALS

TECHNICAL FIELD

The invention pertains to physical vapor deposition target compositions, and also pertains to methods for fabricating materials comprising of face-centered cubic (f.c.c.) unit cell metals or alloys.

BACKGROUND OF THE INVENTION

Physical vapor deposition (PVD) is a technology by which thin metallic and ceramic layers may be deposited on a substrate, and includes, for example, sputtering processes. PVD processes can be utilized in, for example, semiconductor device fabrication to form thin films of material over semiconductor substrates. A difficulty in forming thin films over semiconductor substrates can occur in attempting to maintain uniformity of film thickness and composition over an uneven topography. For instance, semiconductor substrates will frequently have trenches and vias formed therein, and a goal of a sputtering process is to provide a thin film having uniform thickness across a surface of the substrate and within the trenches and vias. As semiconductor devices become increasingly smaller, the aspect ratios of the trenches and vias increase, and it becomes increasingly difficult to provide a uniform thin film within the trenches and vias.

Materials of particular importance in the manufacture of sputtering targets are face centered cubic (f.c.c.) metals such as aluminum, copper, gold, and nickel, and their alloys. Three metallurgical properties of sputtering targets that can influence the performance of the targets are material uniformity (the absence of precipitates, voids, inclusions and other defects), the grain size (with finer grains sizes generally being preferred over more coarse grain sizes), and texture (with texture referring to the strength of particular crystallographic orientations; a "weak" texture comprises a substantially random distribution of crystallographic orientations, and a "strong" texture comprises a predominate crystallographic orientation within the crystallographic orientation distribution).

A strongly <220>-oriented texture can provide optimum target performance in terms of deposition rate and film uniformity, and can also lead to good sidewall and step coverage of trenches and vias with high aspect ratios. Targets with strong <220> orientation can be considered to correspond to an optimal case where the angular distribution of sputtered material is concentrated around the direction normal to the target surface. Specifically atom emission of f.c.c materials can occur preferentially along the <220> close-packed direction. The advantages associated with <220>-oriented texture can be especially pronounced in directional deposition techniques, such as, for example, long throw sputtering, and self-ionized plasma PVD.

In addition to appropriate orientation of texture, small grain size can be an important and desired attribute of a sputtering target. Specifically, small, uniform grain sizes in a sputtering target can enable better-quality thin films to be formed from the target than could be formed from a target having coarser grains. The better-quality aspects that can be achieved with small grains versus coarser grains include, for example, better step coverage of a sputter-coated film over uneven surface topography of an underlying substrate.

It would be desirable to form PVD targets comprising fine grain sizes and strongly <220>-oriented textures (with fine grain size referring to average grain sizes less than about 30 microns, and preferably less than about 1 micron). However, it has proven difficult to obtain such combined properties, and instead average grain sizes are at least 40 microns in targets having <220>-oriented textures. Additionally, it can be difficult to retain <220>-oriented textures during target fabrication. For instance, an axial-oriented <220> texture can be induced in a material by forging cylindrical billets of the material. However, cold or warm forging generally comprises recrystallization annealing of the forged material, and such induces a change in texture from the <220> orientation to the <200> orientation. An effort has been made to avoid such detrimental recrystallization by performing hot forging at a temperature higher than that of static recrystallization of a treated material, and accordingly hot forging has become a widely used method to produce targets with strongly <220>-oriented texture. A difficulty in utilizing hot-forging is that the high processing temperatures and limited straining used in hot forging lead to non-uniform grain sizes significantly larger than 30 microns. Additionally, large second-phase precipitates (>5 microns) can be undesirably induced in a hot-forge-treated target material.

The problems and procedures described above pertain to formation of axial-oriented <220> textures, and similar problems can pertain to formation of planar-oriented <220> textures. It would be desirable to produce planar-oriented <220> textures in addition to the axial-oriented <220> textures, in that planar-oriented <220> textures may be preferred to axial-oriented <220> textures in particular applications, such as, for example, in applications comprising rectangular targets.

As it is difficult to produce PVD targets having axial-oriented or planar-oriented <220> textures with conventional methods, it would be desirable to develop new methods for forming such textures.

SUMMARY OF THE INVENTION

The present invention includes a PVD target. The target comprises a body of f.c.c. metal, and can comprise, for example, one or more of aluminum, copper, silver, gold, nickel, brass, cerium, cobalt (such as cobalt β), calcium (such as calcium α), iron (such as iron γ), lead, palladium, platinum, rhodium, strontium, ytterbium, and thorium. The target can preferably comprise one or more of aluminum, copper, gold, nickel, and platinum. The target can comprise a uniform grain size characterized by an average grain size of less than about 30 microns, and most preferably less than 1 micron; a uniform and strong <220>-oriented texture; and a substantially homogeneous composition at any location, with such composition substantially lacking pores, particles, voids, and inclusions.

In one aspect, the invention encompasses a method of forming a PVD target. The method includes fabrication of a billet from a cast ingot of material, and preliminary thermomechanical treatment of the billet. The thermomechanical treatment can include one or more of homogenizing, hot forging, and solutionizing; and can be conducted at temperature, time and deformation levels which eliminate casting defects, such as, for example, precipitates, voids, and porosity. In addition to the thermomechanical treatment, aging can be conducted to form a uniform dispersion of precipitates within the billet. The precipitates can substantially all have a maximum dimension of less than 0.5 microns.

The billet is extruded several times (such as, for example, from 4 to 8 times), through a die possessing two contiguous and intersecting channels of substantially equal cross-sections relative to one another (so-called Equal Channel Angular Extrusion, or ECAE). The two channels intersect each other at an angle other than 180°. The billet can be passed through the channels via any deformation route, with an exemplary route comprising rotating the billet 90° into the same direction between passes (a so-called "route D").

After the extrusions of the billet, the material of the billet can have a dynamically recrystallized average grain size of less one micron. Also, the extrusions can create a weak, or even totally random texture within the material of the billet.

After the weak texture is formed within the material of the billet, additional processing is conducted to induce a desired <220>-oriented texture within the material of the billet. The additional processing preferably maintains a sub-micron average grain size within the material of the billet while inducing the <220>-oriented texture. An exemplary method of forming a <220>-oriented texture within the material of the billet comprises forging of a round-shaped billet to produce an axial-oriented <220> texture. Another exemplary method of forming a <220> texture within the material of the billet comprises cross-rolling of a rectangular-shaped billet along two perpendicular directions (the directions preferably being congruent with billet axes) to produce a planar-oriented <220> texture. Yet another exemplary method of forming a <220>-oriented texture within the material of the billet comprises cross-rolling of a round-shaped billet along more than four directions to produce an axial-oriented <220> texture. The hot-forging and cross-rolling can induce some grain growth within the material of the billet during inducement of <220>-oriented texture, but preferably the average grain size after the hot-forging and/or cross-rolling is less than 30 microns.

After the <220>-oriented texture is induced within the material of the billet, post deformation recovery annealing can be conducted to enhance the strength of the <220>-oriented textures. The post deformation recovery annealing can be conducted under conditions which maintain a sub-micron average grain size within the material of the billet. In addition to, or alternatively to, the post deformation recovery annealing, intermediate annealing can be conducted on the material of the billet between cross-rolling passes, and/or between forging passes. Also, recrystallization annealing can be conducted at a beginning stage of static recrystallization to conserve dominant <220>-oriented texture and have an average grain size within the material of the billet comprise from a few microns to less than 30 microns.

In addition to the methodology described above, the invention encompasses PVD target constructions and compositions.

BRIEF DESCRIPTION OF THE DRAWINGS

Preferred embodiments of the invention are described below with reference to the following accompanying drawings.

FIG. 1 is a diagrammatic, cross-sectional view of material being treated with an ECAE apparatus.

FIG. 2 illustrates a process of forging a circular billet.

FIG. 3 illustrates a process of cross-rolling a rectangular billet along two perpendicular directions.

FIG. 4 illustrates a process of cross-rolling a circular billet in four directions.

FIGS. 5(a–h) are graphical illustrations of the evolution of an axial-oriented <220> texture strength in a material comprising Al and 0.5% Cu. The graphs illustrate texture within a material and correspond to inverse pole figures after ECAE and further forging at a processing temperature of 150° C. up to 50% (a, b), 62% (c, d) and 72% (e, f) reduction, either in the as-deformed condition (a, c, e), or after annealing at 175° C. for 1 hour (b, d, f). The <220> pole figures (g) and (h) correspond respectively to inverse pole figures (e) and (f). In all of the illustrated cases, the average grain size is about 0.5 micron.

FIGS. 8(a–h) are graphical illustrations of the evolution of <220> planar-oriented texture strength in a material comprising Al and 0.5% Cu. The graphs illustrate texture within a material and correspond to inverse pole figures after ECAE and cross rolling along two directions at 50% (a, b), 75% (c, d) and 90% (e, f); in the as-deformed condition (a, c, e), and after annealing for 150° C. and 1 hour (b, d, f). The <220> pole figures (g) and (h) correspond respectively to inverse pole figures (e) and (f). In all of the illustrated cases, the average grain size is about 0.5 micron.

FIGS. 10(a and b) graphically illustrate strong <220> planar-oriented texture obtained in 99.9998% pure Cu after ECAE and 75% cross-rolling for 8 passes, with (a) showing a <220> pole figure, and (b) showing a <001> inverse pole figure. The average grain size is about 0.5 micron.

FIGS. 12(a–d) are graphical illustrations of planar-oriented <220> texture of a material comprising Al and 0.5%

Cu. The deformation comprises ECAE and subsequent cross-rolling at 90%, for 12 passes. The effect of recovery annealing on the strengths of the planar <220> texture is illustrated by inverse pole figures (a) (b) and (c); with (a) showing the material after recovery annealing at 150° C. for 2 hours, (b) showing the material after recovery annealing at 175° C. for 1 hour, and (c) showing the material after recovery annealing at 200° C. for 1 hour. All of the samples pertaining to FIGS. 12(a–c) had stable average grain sizes of about 0.5 micron. The <220>-oriented texture is illustrated after recrystallization annealing by inverse pole figure (d), and specifically is shown after annealing at 225° C. for 1 hour, and after allowing for a first stage of static recrystallization. The sample utilized for FIG. 12(d) had an average grain size of about 5 microns.

FIGS. 13(a and b) are graphical illustrations of the evolution of the strength of <220> planar-oriented texture in a material comprising Al and 0.5% Cu after ECAE and cross-rolling at 90% during 12 passes along two perpendicular directions in function of recovery annealing. Graph (a) illustrates evolution of respective percentage ratios of <220>, <200>, <113> and <111> planes, and graph (b) illustrates evolution of OD index. The data is plotted for a material after recovery annealing at 150° C. for 2 hours; after annealing at 175° C. for 1 hour; and after annealing at 200° C. for 1 hour. In all of the illustrated cases, the average grain size is about 0.5 micron.

FIG. 14 is a graphical illustration of the evolution of the strength of <220> planar-oriented texture in a material comprising Al, 0.2% silicon and 0.5% Cu after ECAE and cross-rolling at 75% during 8 passes along two perpendicular directions in function of recovery annealing. The evolution of a respective percentage ratio of <220>, <200>, <113> and <111> planes is shown after recovery annealing at 150° C. for 3 hours, 170° C. for 3 hours and 200° C. for 3 hours. In all of the illustrated cases, the average grain size is about 0.5 micron.

Figure 15:
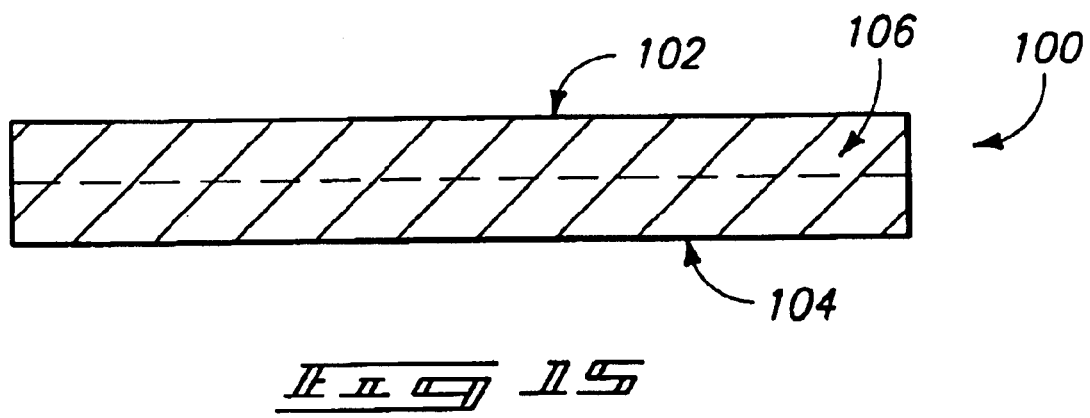

FIG. 15 is a diagrammatic, cross-sectional view of a sputtering target encompassed by the present invention.

DETAILED DESCRIPTION OF THE PREFERRED EMBODIMENTS

The invention encompasses a method for producing physical vapor deposition targets, such as sputtering targets, having uniform average grain sizes of less than 30 microns (preferably less than 1 micron), and axial-oriented or planar-oriented <220> texture of controllable strength. The targets can further comprise substantially no casting defects, and in particular can comprise, for example, no (or very few) voids, particles, and inclusions. The present invention encompasses utilization of equal channel angular extrusion (ECAE) in combination with one or both of forging and cross-rolling to induce a desired texture in a metallic material. ECAE is described generally in U.S. Pat. Nos. 5,400,633; 5,513,512; 5,600,989; 5,850,755 and 5,590,389, all of which are hereby incorporated by reference in this document.

Methodology of the present invention can utilize ECAE to deform f.c.c unit cell metals and alloys. The deformation can occur at low temperature, and with a processing route and number of passes through an ECAE device chosen to create weak or random texture. The deformation can also refine structures to create very fine grain sizes within the processed material, preferably less than one micron.

After the ECAE, additional cross-rolling and/or forging of the deformed material can be utilized to create planar-oriented or axial-oriented <220> textures within the material. The low temperature ECAE can provide dynamically recrystallized superfine-grained materials which remain dynamically recrystallized and superfine-grained after cold or warm forging and/or cross-rolling (provided that the processing occurs at a temperature lower than that of static recrystallization of the processed material). Because superfine-grained structure stays dynamically recrystallized, a recrystallization annealing treatment can be avoided. For this reason and others, methodology of the present invention can be utilized to form sputtering targets having fine uniform average grain sizes, preferably less than one micron; and also having strong <220>-oriented textures.

In other aspects of the invention, hot forging or cross-rolling at a processing temperature higher than that of the static recrystallization temperature of the considered material is performed after the ECAE step. Careful control of processing temperature, recrystallization and limited grain growth of the ECAE extruded superfine-grained materials can be utilized during hot forging and/or cross-rolling to form a sputtering target having a dominant <220>-oriented texture and a uniform grain size, with an average size being less than 30 microns.

In yet other aspects of the invention, a material can be subjected to recovery annealing after low temperature ECAE; cold or warm cross-rolling; and/or forging. Recovery annealing can enhance the strength of an as-deformed <220>-oriented texture while maintaining the grain size of the superfine-grained structure created by ECAE. An average grain size can be, for example, less than one micron. If the recovery annealing treatment is conducted, a sputtering target formed from the material can have a strong <220>-oriented texture and a uniform fine grain size, of, for example, less than one micron.

In some aspects of the present invention, a material is subjected to static recrystallization treatment in addition to the cross-rolling and/or forging. If such static recrystallization treatment is performed on a material, a sputtering target formed from the material can have a dominant <220>-oriented texture and a uniform grain size, with the average grain size being less than 30 microns.

If the invention is utilized to form sputtering targets, the targets can comprise an f.c.c. unit cell metal (i.e., a metal having a crystallographic structure that can be defined by an f.c.c. unit cell, such as, for example, one or more of aluminum, copper, silver, gold, nickel, brass, cerium, cobalt β, calcium α, iron γ, lead, palladium, platinum, rhodium, strontium, ytterbium, and thorium), having a uniform <220> axial-oriented or planar-oriented texture with controllable strength. The sputtering targets can further comprise an average grain size of less than 30 microns (and in particular applications less than 1 micron), a homogeneous material composition throughout, an absence of casting defects (such as, for example, pores, voids, and inclusions), and extremely fine and uniformly distributed precipitates/phases with maximum dimensions of the precipitates/phases being less than 0.5 μm (and in particular applications can comprise an absence of precipitates/phases).

In particular embodiments, methodology of the present invention can be utilized in formation of PVD targets (such as sputtering targets) from cast materials. An initial step can be to reduce or eliminate second-phase precipitates, pores, voids, inclusions and any other casting defects from the cast materials, and to create a homogeneous composition throughout the materials. The reduction of casting defects can be performed prior to any processing by equal channel angular extrusion (ECAE), and can comprise thermo-mechanical treatment of a cast ingot material. Among the common thermo-mechanical treatments, homogenizing, solutionizing, aging, and hot-forging are relatively commonly utilized for metallurgical processing. Homogenizing can be utilized to accomplish complete (or substantially complete) redistribution of macro- and micro-segregations present in as-cast ingots, and can also be utilized to provide a uniform composition of constitutive elements and dopants throughout a billet formed from an as-cast ingot material. Hot forging can be used to break down as-cast dendritic structures and to remove casting defects such as voids, porosity, cavities and inclusions. Solutionizing can be utilized to produce precipitate-free billets from as-cast materials by dissolving into solution any second-phase precipitate present inside the microstructure of the materials. Finally, aging can be utilized to produce an extremely fine and uniform distribution of second-phase precipitates throughout a billet of as-cast material. The precipitates can have, for example, a maximum dimension of less than 0.5 microns. A fine and uniform distribution of precipitates can enhance a stability of microstructures formed by deformation processes. Aging can be done as a heat treatment after a solutionizing step, and can be done before or after ECAE.

The above-described thermo-mechanical treatments of homogenizing, hot-forging and solutionizing can cause dramatic increase in grain and particle sizes within a treated material, but subsequent ECAE treatment of the material in accordance with the present invention can reduce the grain and particle sizes to desired values. Accordingly, preliminary treatments such as homogenizing, hot forging, solutionizing and/or aging can be performed at optimized strains, time and temperature, regardless of the effect of such optimized conditions on grain size and/or particle size.

After the preliminary process of billet formation, homogenizing, hot forging, solutionizing, and/or aging; a metallic material is subjected to severe plastic deformation to randomize crystallographic orientation of the material (i.e., weaken texture), and reduce grain size. An exemplary method of inducing severe plastic deformation is ECAE. FIG. 1 illustrates an exemplary ECAE device 10. Device 10 comprises a mold assembly 12 that defines a pair of intersecting channels 14 and 16. Intersecting channels 14 and 16 are identical in cross-section (or at least substantially identical, with the term "substantially identical" indicating that the channels are identical within acceptable tolerances of an ECAE apparatus).

In operation, a billet 18 of metallic material is extruded through channels 14 and 16. Such extrusion results in plastic deformation of the billet by simple shear, layer after layer, in a thin zone located at the crossing plane of the channels.

ECAE can introduce severe plastic deformation in the material of the billet shape, while leaving the dimensions of the billet unchanged. ECAE can be a preferred method for inducing severe strain in a metallic material in that ECAE can be utilized at low loads and pressures to induce strictly uniform and homogeneous straining. Additionally, ECAE can achieve a high deformation per pass ($\epsilon=1.17$); can achieve high accumulated strains with multiple passes through an ECAE device (at N=4 passes, $\epsilon=4.64$); and can be utilized to create various textures/microstructures within materials by utilizing different deformation routes (i.e. by changing an orientation of a billet between passes through an ECAE device).

In an exemplary method of the present invention, ECAE is conducted at a strain rate and processing temperature sufficient to obtain desired microstructures (i.e., a weak texture and small grain size) within a billet of metallic material, and to generate a uniform stress-strain state throughout the billet. The billet of material can be passed through an ECAE apparatus several times, and with numerous routes, and at a temperature which can correspond to cold or hot processing of the material. A preferred route to utilize with multiple passes through an ECAE apparatus can be the so-called "route D", which corresponds to a constant 90° billet rotation before each successive pass. An exemplary number of passes through an ECAE apparatus is from 4 passes to 8 passes. Such exemplary number is generally found sufficient to promote grain refinement to sub-micron size by mechanically induced dynamic recrystallization. For example, typical grain sizes averaging from about 0.2 to about 0.5 microns are obtained from exemplary metallic materials, such as, Al with 0.5% Cu; Al with 0.2% Si and 0.5% Cu; Al with 1% Si and 0.5% Cu; Al with 0.2% Ti and 0.5% Cu; and 99.999% Cu. All listed percentage compositions are to be understood as being weight percentages, unless specified otherwise. The above-listed metallic materials are commonly used for target production, and the grain sizes formed in the materials can be smaller by at least a factor of about 100 as compared to the grain sizes found in identical materials processed by methodology other than ECAE. Also, the texture strength of the materials can be reduced by a factor of from about 3 to about 5 compared to the texture strength found in identical materials processed by methodology other than ECAE.

A recovery annealing treatment can be conducted to stabilize the sub-micron structures formed by ECAE.

After ECAE is utilized to reduce grain size and weaken the texture of a metallic material, subsequent processing (such as forging and/or cross-rolling) can be utilized to induce strong and uniform <220>-oriented textures within the material. The dynamically recrystallized sub-micron structures produced in a metallic material by ECAE can have properties associated therewith that are well-suited to development of strong and uniform <220>-oriented textures upon further cross-rolling or forging. For instance, materials subjected to ECAE can subsequently exhibit a near ideal plastic mechanical behavior (i.e., can be a near optimal body to develop crystallographic texture, in accordance with the theory of plasticity). Also, materials subjected to ECAE can subsequently exhibit a weak or close-to-random texture. Such texture can be beneficial for subsequent texture development through, for example, forging or cross-rolling, because there is a statistically equal opportunity for each grain to reach the final orientation imposed by the texture development step. In contrast, a material having a strong texture is more difficult to utilize for inducing subsequent texture development.

Also, ECAE dynamically recrystallized sub-micron structures can accommodate further straining (such as straining induced in subsequent texture development steps) in a different way than microstructures with grain sizes of several microns. Mechanisms of grain boundary sliding and grain rotation become more important for the sub-micron structures as compared to classic intra-granular crystallographic slip. As a result, ECAE-formed sub-micron structures can stay dynamically recrystallized during further processing (such as, for example, cold or warm cross-rolling or forging), and can maintain a globally equiaxed sub-micron grain size with less intragranular dislocations than larger-grain-size structures. Accordingly, <220>-oriented textures can be induced in ECAE-formed sub-micron structures by, for example, cross-rolling or forging, while maintaining average grain sizes of the structures of less than 1 micron.

It is noted that the sub-micron structures formed by ECAE can be subjected to annealing under conditions allowing for static recrystallization, but that such will generally increase the grain size of the structures and so can be less preferred than simply avoiding such annealing. However, if additional processing (such as, for example, hot forging or cross-rolling) is conducted at temperatures higher than that of static recrystallization of ECAE-formed sub-micron structures, the uniform and fine grain size of the ECAE-formed sub-micron structures can still have advantages. For instance, even though the grains will grow due to the temperature exceeding that of static recrystallization, the uniformity of the grain sizes can remain to form a material having uniform grains of average size of, for example, from about 1 micron to about 30 microns.

Any of numerous deformation methods can be utilized to induce straining in a material after ECAE and thereby produce desired textures in desired directions. Three embodiments are described herein with reference to FIGS. 2–14.

Referring first to FIG. 2, a process is illustrated for subjecting a circular billet 20 to a forging operation to induce an axial-oriented <220> texture within the material of the billet. Billet 20 has an upper circular surface 22 and a lower circular surface 24, and can subsequently be utilized to form a PVD target having a sputtering surface defined by either the upper circular surface 22 or the lower circular surface 24. By definition, an axial-oriented or fiber <220> texture within a PVD target has grains predominantly orientated with their <220> plane parallel to the target sputtering surface and the direction <uvw> of their crystal lattice perpendicular (or nearly perpendicular) to the sputtering target surface.

It is noted that ECAE is typically conducted with rectangular or square billets. Circular billet 20 can be formed after ECAE of a square billet by cutting the square billet into a circular shape. FIG. 2 illustrates a square ECAE billet shape in phantom view as 25, and shows that circular billet 20 can be cut from such square billet. The circular-shaped geometry of billet 20 can insure an axi-symmetrical upsetting deformation induced by appropriate forging, which can provide a uniform <220> orientation throughout the billet.

A forging apparatus 30 is shown diagrammatically in FIG. 2, and is shown to comprise a pair of plates 32 and 34 which can be displaced relative to one another to press billet 20 between them. Plates 32 and 34 can be displaced by, for example, a power source (not shown), such as a motor or hydraulic ram. It is noted that the displacement of plates 32 and 34 can comprise displacement of only one of the plates, or displacement of both of the plates.

The illustrated forging is preferably performed under frictionless conditions to optimize texture uniformity. One method for achieving frictionless forging is to machine pockets 36 and 38 into plates 32 and 34, respectively, and to then fill the pockets with lubricant. The lubricant can lubricate the surfaces of billet 20 that contact the forging equipment.

Two parameters that can play an important role in the forging of FIG. 2 are the total amount of deformation achieved by the forging (i.e., the percent reduction), and the temperature of billet 20 during the forging. If the temperature of billet 20 remains less than the temperature of static recrystallization during the forging, then increases in one or both of forging temperature and amount of total deformation can enhance the strength of <220> axial-oriented texture while maintaining the ultrafine ECAE grain size of preferably less than 1 micron.

Figure 6:
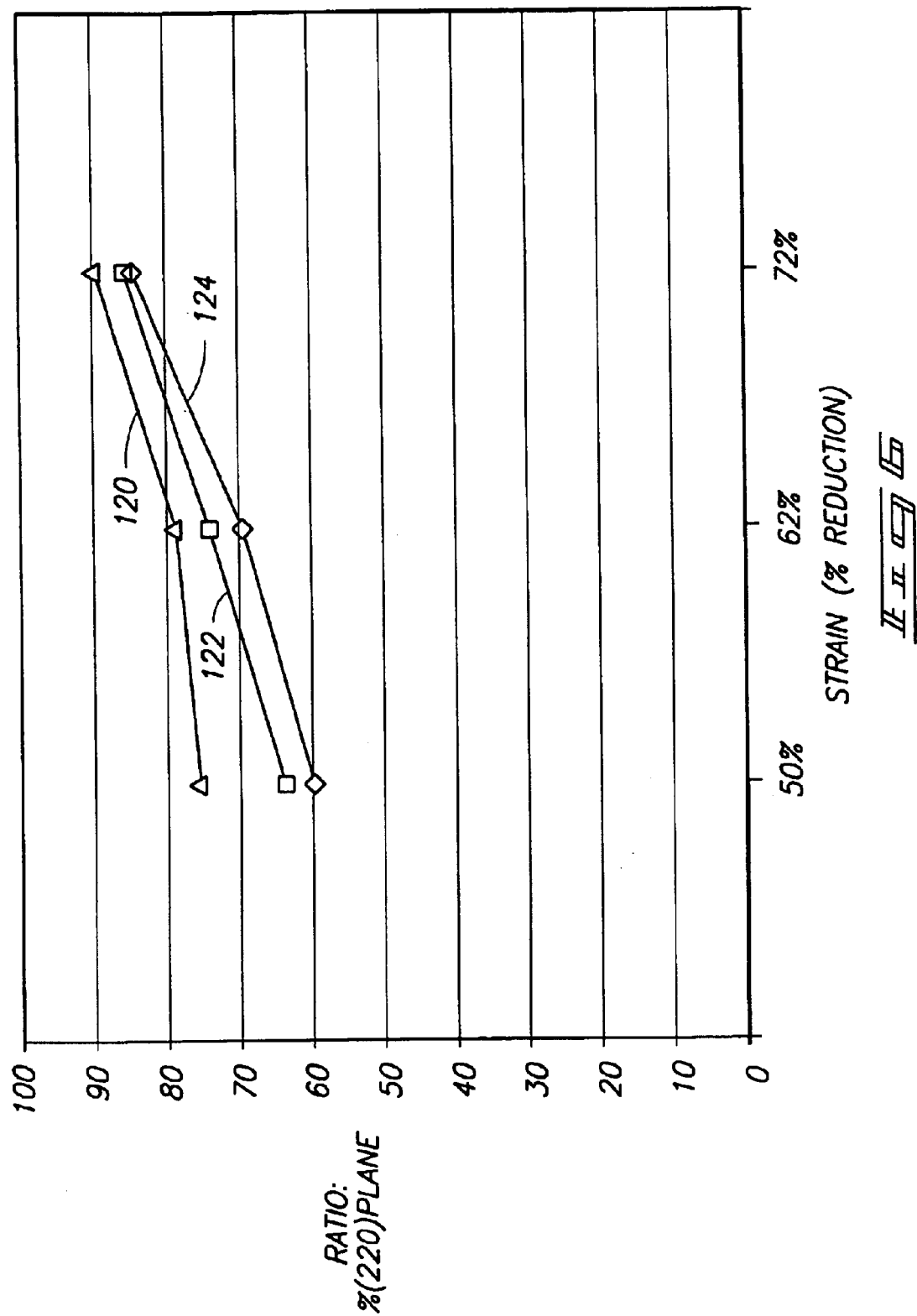
FIG. 6 is a graphical illustration of the evolution of the strength of an axial-oriented <220> texture in a material comprising Al and 0.5% Cu, after ECAE and warm forging. More specifically, the figure shows evolution of the percentage ratio of a <220> plane for either 50%, 62% or 72% forging at 150° C. in the as-deformed condition (124), after annealing at 100° C. for 1 hour (122), and after annealing at 175° C. for 1 hour (120).

FIGS. 5 and 6 illustrate exemplary data obtained from billets comprising Al and 0.5% Cu after ECAE and various forging processes. More specifically, the displayed data is obtained after forging billets at a temperature of 150° C. and deformations up to 50% reduction (FIG. 5a); 62% reduction (FIG. 5c) and 72% reduction (FIGS. 5e, 5g). The axial-oriented character of texture is recognizable by the ring pattern of <220> pole figure in FIG. 5g. In all of the illustrated cases of FIG. 5, the average grain size is 0.5 micron. The data of FIG. 5 illustrates that a maximum in inverse pole figure increases gradually from 2.7 to 7.76 times random (t.r.) (FIGS. 5a, 5c, 5e). FIG. 6 illustrates a percentage of <220> ratios, and indicates that such percentage increases gradually from 60% to 85%. More specifically, FIG. 6 shows evolution of the percentage ratio of a <220> plane for 75% reduction forging at 150° C. in the as deformed condition (124), after annealing at 100° C. for 1 hour (122), and after annealing at 175° C. for 1 hour (120).

Figure 7:
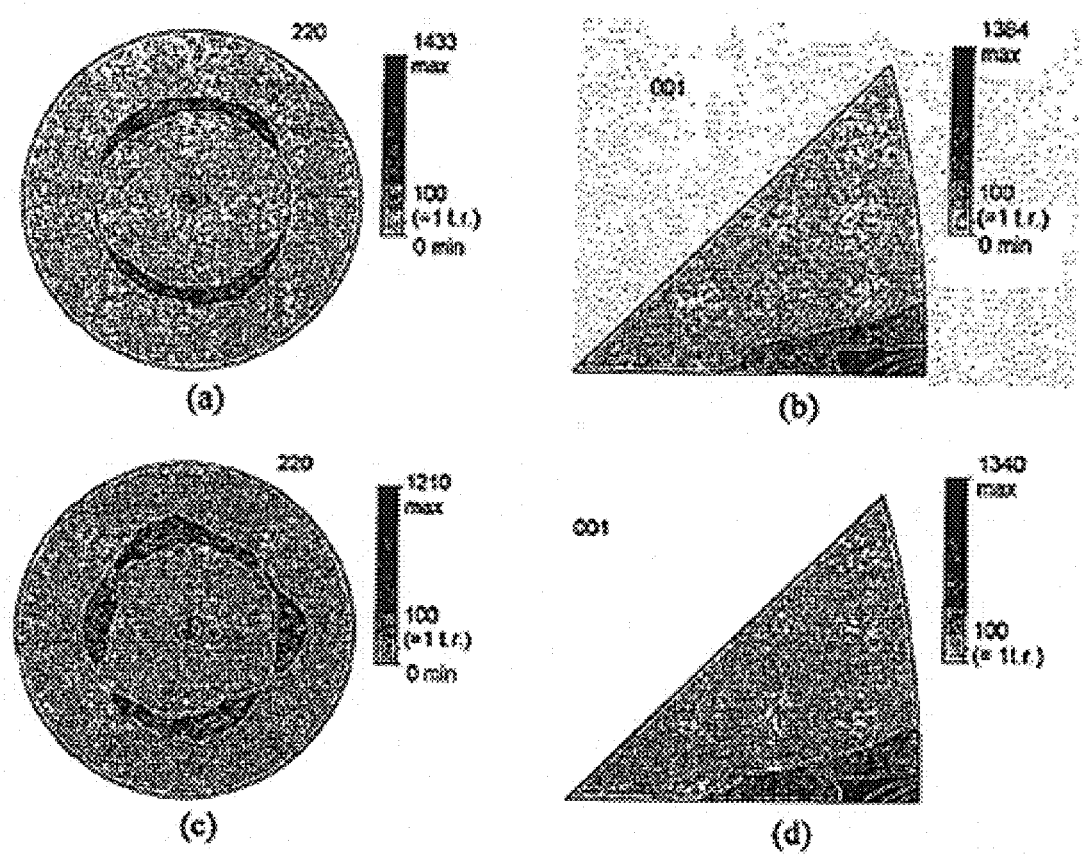
FIGS. 7(a–d) are graphical illustrations of an axial-oriented <220> texture in a material comprising Al and 0.5% Cu. The graphs (a) and (b) correspond to the material after ECAE and 75% forging at 250° C., and annealing at 225° C. for 0.5 hour; with (a) showing a <220> pole figure and (b) showing a <001> inverse pole figure. The average grain size of the material graphical illustrated in (a) and (b) is about 10 microns. The graphs (c) and (d) correspond to the material after ECAE and 75% forging at 350° C., and self-annealing; with (c) showing a <220> pole figure and (d) showing a <001> inverse pole figure. The average grain size of the material graphical illustrated in (c) and (d) is about 30 microns.

If the temperature of billet 20 exceeds the temperature of static recrystallization during the forging, the forging deformation and temperature can be optimized to obtain a <220> texture and limit the recrystallized grain size to less than 30 microns. FIG. 7 illustrates exemplary data obtained from billets comprising Al and 0.5% Cu after ECAE and various forging processes. FIGS. 7(a) and 7(b) illustrate strong <220> axial-oriented texture developed after ECAE and hot forging at 250° C., and further annealing at 225° C. for 0.5 hour. The average grain size of the material utilized in generating the data of FIGS. 7(a) and 7(b) is about 10 microns. FIGS. 7(c) and 7(d) display strong <220> axial-oriented texture after hot forging at 350° C. The average grain size of the material utilized in generating the data of FIGS. 7(c) and 7(d) is about 30 microns, and the corresponding <220> ratio is about 80%.

Referring again to FIG. 2, billet 20 is shown after forging as a flatter circular-shaped material than it was before forging. Billet 20 can be utilized directly as a sputtering target after the forging, with one of surfaces 22 and 24 being a sputtering surface, or can be subjected to machining to form the billet into a desired target shape. Also, billet 20 can be subjected to further heat treatment after the forging of FIG. 2 to alter a composition within billet 20 (such as, for example, to increase an average grain size within billet 20 and/or to stabilize a texture of the material within billet 20), if an altered composition is desired for a particular target construction.

The embodiment of FIG. 2 encompasses forging of circular shaped ECAE billets at appropriate strains and forging temperatures to produce weak to strong axial-oriented <220> textures, and either maintain sub-micron ECAE average grain sizes or create larger average grain sizes that are, for example, larger than 1 micron and less than or equal to about 30 microns. It is noted, however, that forging of thin disc products (like particular sputtering target constructions) with large diameter to thickness ratios can be complicated. In particular, at low temperature and for large-sized targets, expensive tooling and high loads and pressures can be desired. Such practical difficulties can be overcome by using embodiments of the present invention which comprise cross-rolling after the ECAE step to develop <220> texture.

An embodiment of the present invention encompassing cross-rolling is described with reference to FIG. 3. The embodiment of FIG. 3 can produce <220> planar-oriented texture of controllable strength and grain size less than or equal to about 30 microns, preferably less than 1 micron, by using cross-rolling along two perpendicular directions. A cube-shaped billet 50 is shown comprising an upper square-shaped surface 52, a lower square-shaped surface 54 (not visible in the view of FIG. 3), and four side surfaces 56 (only three of which are visible in the view of FIG. 3). Billet 50 can comprise other shapes besides the shown cube-shape, including shapes wherein at least two of the surfaces are rectangular shaped instead square-shaped. Billet 50 can ultimately be utilized to form a PVD target having a sputtering surface defined by either the upper surface 52 or the lower surface 54. By definition, a planar-oriented or sheet <220> texture has grains predominantly with their <220> plane parallel to the target surface and the direction <uvw> of their crystal lattice belonging to the target surface.

A first axis $X_1$ is shown extending along the upper surface 52, and a second axis $X_2$ is shown extending perpendicular to axis $X_1$. FIG. 3 diagrammatically illustrates a cross-rolling apparatus 60 comprising a pair of rollers 62 and 64. Billet 50 is passed between rollers 62 and 64 to compress billet 50 and thereby deform billet 50. As shown, billet 50 is first rolled along one of either axis $X_1$ or axis $X_2$, and then is rolled along the other of axis $X_1$ or axis $X_2$ to accomplish cross-rolling of billet 50 along two perpendicular directions. Rolling conditions can be utilized which provide near uniform plane stress-strain state during each pass of billet 50 through cross-rolling apparatus 60. Preferably, cross-rolling directions are chosen which are congruent to billet axes, as shown.

Three parameters that can be important during the cross-rolling of FIG. 3 are a temperature of billet 50 during the cross-rolling; the total amount of deformation induced by the cross-rolling (i.e., the total cross-rolling reduction); and the number of cross-rolling passes to which billet 50 is exposed (this can also be expressed as the incremental deformation of billet 50 achieved per pass).

The cross-rolling of FIG. 3 is preferably conducted at a temperature whereby the material of billet 50 remains below its static recrystallization temperature. Such can enable the ultra-fine grain size introduced by ECAE processing to remain in the material of the billet during the cross-rolling. If, however, cross-rolling is conducted at a temperature at which the material of billet 50 exceeds its static recrystallization temperature, the processing temperature can be optimized to create <220> textures in the material of billet 50 and micrometer structures with an average grain size of less than about 30 microns.

Larger levels of total cross-rolling reduction and/or increasing numbers of cross-rolling passes can gradually increase the strength of <220> planar-oriented texture induced into the material of billet 50. The total amount of cross-rolling reduction is preferably greater than 50–60%, and the number of rolling passes is chosen so that an incremental cross-rolling reduction of preferably between 5% and 20% is achieved by each pass. Utilization of sufficient cross-rolling reduction and an appropriate number of rolling passes can enable an optimal distribution of strain-stress state to be achieved across a thickness of billet 50.

FIGS. 8 and 9 illustrate exemplary data obtained from billets comprising Al and 0.5% Cu after ECAE and subsequent cross-rolling along two perpendicular directions; and show effects of the two combined parameters of total cross-rolling reduction and number of cross-rolling passes. Specifically, FIG. 8 comprises graphs illustrating texture within a material, and FIG. 9 comprises a graph (a) illustrating evolution of percentage of <220> orientation, and a graph (b) illustrating evolution of OD index in function of the cross-rolling reduction (50%, 75% and 90%). The data of FIG. 9 is plotted for a material in the as-deformed condition (300 in graph (a) and 310 in graph (b)); after annealing at 100° C. for 1 hour (302 in graph (a) and 312 in graph (b)); and after annealing at 150° C. for 1 hour (304 in graph (a) and 314 in graph (b)). The <220> ratio of graph 9(a) is calculated from the four planes <200>, <220>, <113>, and <111>. In all of the illustrated cases, the average grain size is about 0.5 micron.

Figure 9A:
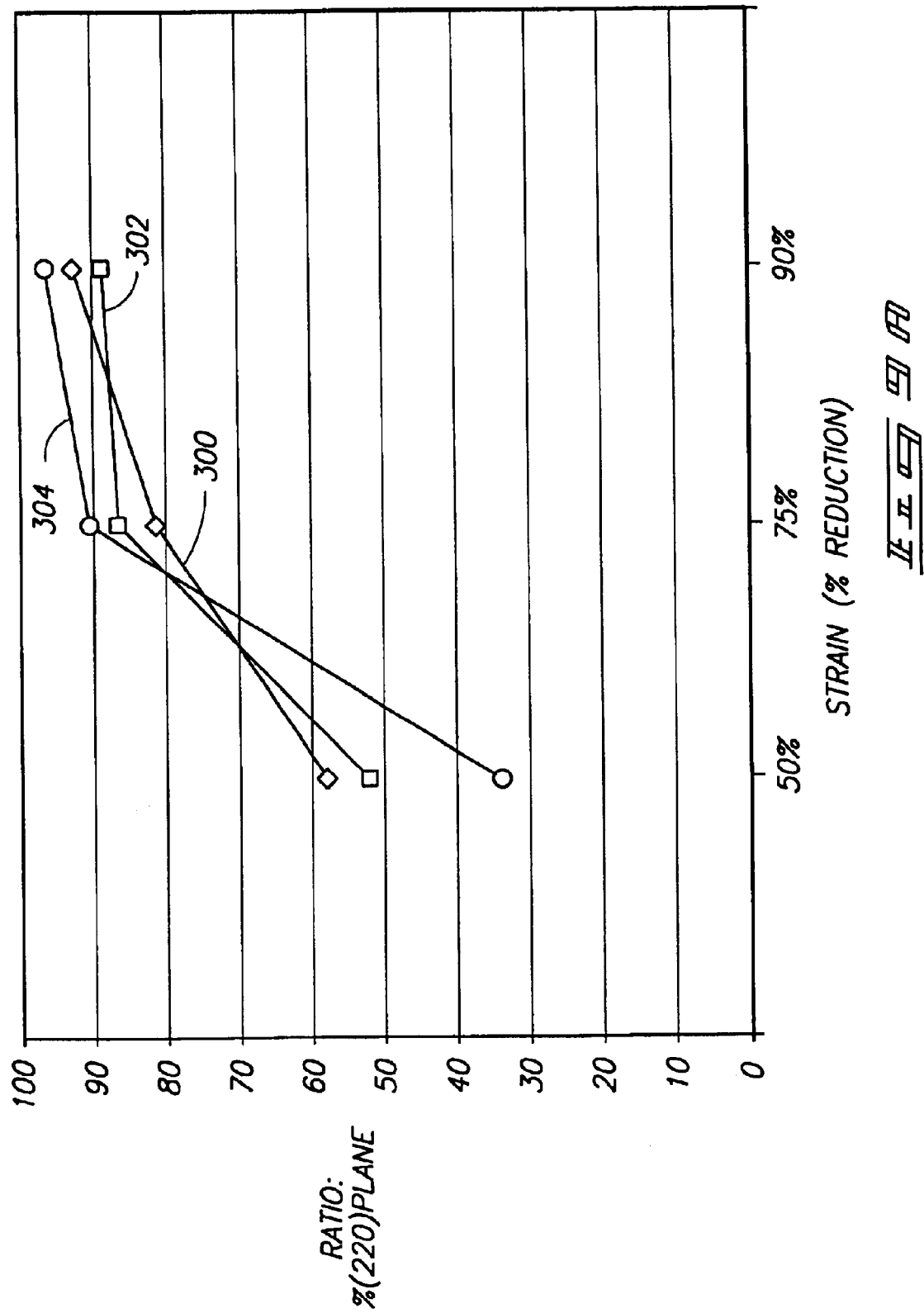
FIGS. 9(a an b) are graphical illustrations of the evolution of the strength of <220> planar-oriented texture in a material comprising Al and 0.5% Cu after ECAE and cross-rolling along two perpendicular directions. Graph (a) illustrates evolution of percentage of <220> orientation, and graph (b) illustrates evolution of OD index as a function of the cross-rolling reduction (50%, 75% and 90%). The data is plotted for a material in the as-deformed condition (300 in graph (a) and 310 in graph (b)); after annealing at 100° C. for 1 hour (302 in graph (a) and 312 in graph (b)); and after annealing at 150° C. for 1 hour (304 in graph (a) and 314 in graph (b)). The <220> ratio of graph (a) is calculated from the four planes <200>, <220>, <113>, and <111>. In all of the illustrated cases, the average grain size is about 0.5 micron.
Figure 9B:
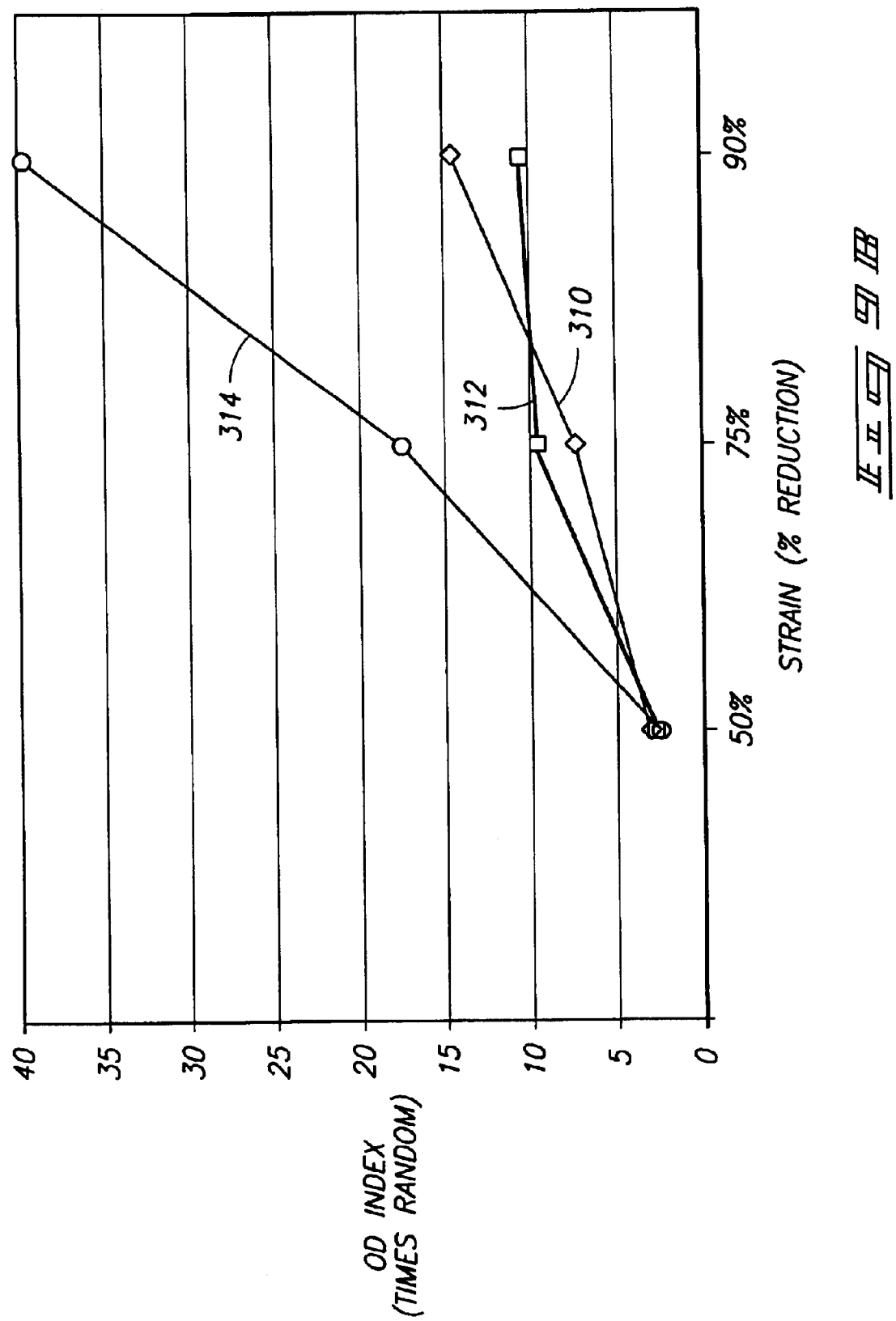

At 50% reduction for 4 passes (FIG. 8(a)), a weak <220> texture is present with a <220> ratio of around 58% (FIG. 9(a)), and an OD index of 3 times random (FIG. 9(b)). After 75% reduction for eight passes (FIG. 8(c)) and 90% reduction for twelve passes without annealing (FIGS. 8(e) and 8(g)), medium to strong <220> textures are gradually obtained as shown by the increase in maximum of the inverse pole figure (FIGS. 8(c) and 8(e)), <220> ratio (respectively, 82% and 93% in FIG. 9(a)) and OD index (respectively, 7 and 15 times random in FIG. 9(b)). Also, <220> pole figures exhibit only individual poles instead of ring patterns (FIG. 8(g)).

FIG. 10 shows that high purity Cu (specifically, 99.9998% pure) can also be processed according to the methodology of FIG. 3, and that are similar results are achieved as discussed above for an aluminum/copper alloy. Specifically, FIG. 10 shows that ECAE and 75% cross-rolling along two perpendicular directions (via 8 passes) induced a strong <220> texture in the copper, with a <220> ratio of 84%.

Referring again to FIG. 3, billet 50 is shown after forging as a flatter material than it was before forging. Billet 50 can be utilized directly as a sputtering target after the forging, with either the upper surface 52 or the lower surface 54 being a sputtering surface; or can be subjected to machining to form a desired target shape. FIG. 3 shows a phantom view of a circular target shape 65 that can be cut or otherwise machined from billet 50 after cross-rolling. The material of billet 50 can be subjected to further heat treatment after the cross-rolling of FIG. 3 to alter a composition within billet 50 (such as, for example, to increase an average grain size within billet 50 and/or to stabilize a texture of the material of billet 50), if an altered composition is desired for a particular target construction.

The embodiment of FIG. 3 encompasses cross-rolling of preferably rectangular-shaped ECAE billets along two perpendicular directions at appropriate straining, number of cross-rolling passes and processing temperature to induce planar-oriented <220> texture while either maintaining the ECAE sub-micron grain size, or producing larger grain sizes. The larger grain sizes can be, for example, larger than 1 micron and less than or equal to about 30 microns.

The embodiment of FIG. 3 utilizes cross-rolling to form a planar-oriented <220> texture. Another embodiment is described with reference to FIG. 4 in which cross-rolling is utilized to form axial-oriented <220> texture after ECAE. The utilization of cross-rolling to form axial-oriented <220> texture can be preferred relative to the forging described with reference to FIG. 2, in that cross-rolling can frequently be utilized at a lower processing cost than forging.

The embodiment of FIG. 4 can produce <220> axial-oriented texture of controllable strength and grain size less than or equal to about 30 microns, preferably less than 1 micron, by using cross-rolling after ECAE. The cross-rolling is along 4 or more different rolling directions, which are spaced evenly relative to one another in order to insure near axi-symmetrical deformation. A circular-shaped billet 70 is shown, and is shown relative to a square billet 71 (phantom view) from which circular-shaped billet can be cut. The circular-shape of billet 70 can enable optimal uniformity of texture to be achieved by the processing of FIG. 4. Circular-shaped billet 70 can be identical to the circular-shaped billet 20 described with reference to FIG. 2, and can be formed by identical processing as described previously relative to billet 20.

Billet 70 comprises a front surface 72 and an opposing back surface (not visible in the view of FIG. 4). Billet 70 can ultimately be utilized to form a PVD target having a sputtering surface defined by either the front surface 72 or the back surface.

A first axis X is shown extending along front surface 72, and a second axis Y is shown extending perpendicular to axis X. FIG. 4 diagrammatically illustrates the directions of four passes of billet 70 through a cross-rolling apparatus (not shown in FIG. 4, but which can be identical to the cross-rolling apparatus 60 described above with reference to FIG. 3). As shown, billet 70 is first rolled along axis Y (rolling direction 74), and then is rolled along axis X (rolling direction 76). Subsequently, billet 70 is rolled along an axis 78 which is displace 45° relative to axis Y (the axis Y is shown in phantom in the third rolling sequence of FIG. 4 so that it can be seen that axis 78 is at a 45° angle relative to axis Y), and is then rolled along an axis 80 which is displaced 90° relative to axis 78 (the axis 78 is shown in phantom in the fourth rolling sequence of FIG. 4 so that it can be seen that axis 80 is at a 90° angle relative to axis 78). It is to be understood that even though FIG. 4 illustrates an embodiment in which 4 cross-rolling passes are conducted at 45° relative to adjacent passes, the invention encompasses embodiments wherein more than 4 passes are utilized. For instance, the invention encompasses embodiments wherein 8 passes are utilized, with each of the passes being at 22.5° relative to adjacent passes. In other words, multiple rolling passes are conducted across a surface of billet 70, with each pass being along a diameter of the billet 70 and extending along a separate axis than the other passes, and with the separate axes being equidistantly spaced from one another along a circular outer periphery of billet 70. It is noted that the invention can also encompass embodiments in which at least some passes are along a same axis as other passes.

Among the parameters that can be important during the cross-rolling of FIG. 4 are a temperature of the billet during the cross-rolling; the total amount of deformation induced by the cross-rolling; and the number of cross-rolling passes to which the billet is exposed (or the incremental deformation of the billet achieved per pass). Such parameters can have similar effects as those described previously with respect to the cross-rolling of FIG. 3.

Figure 11A:
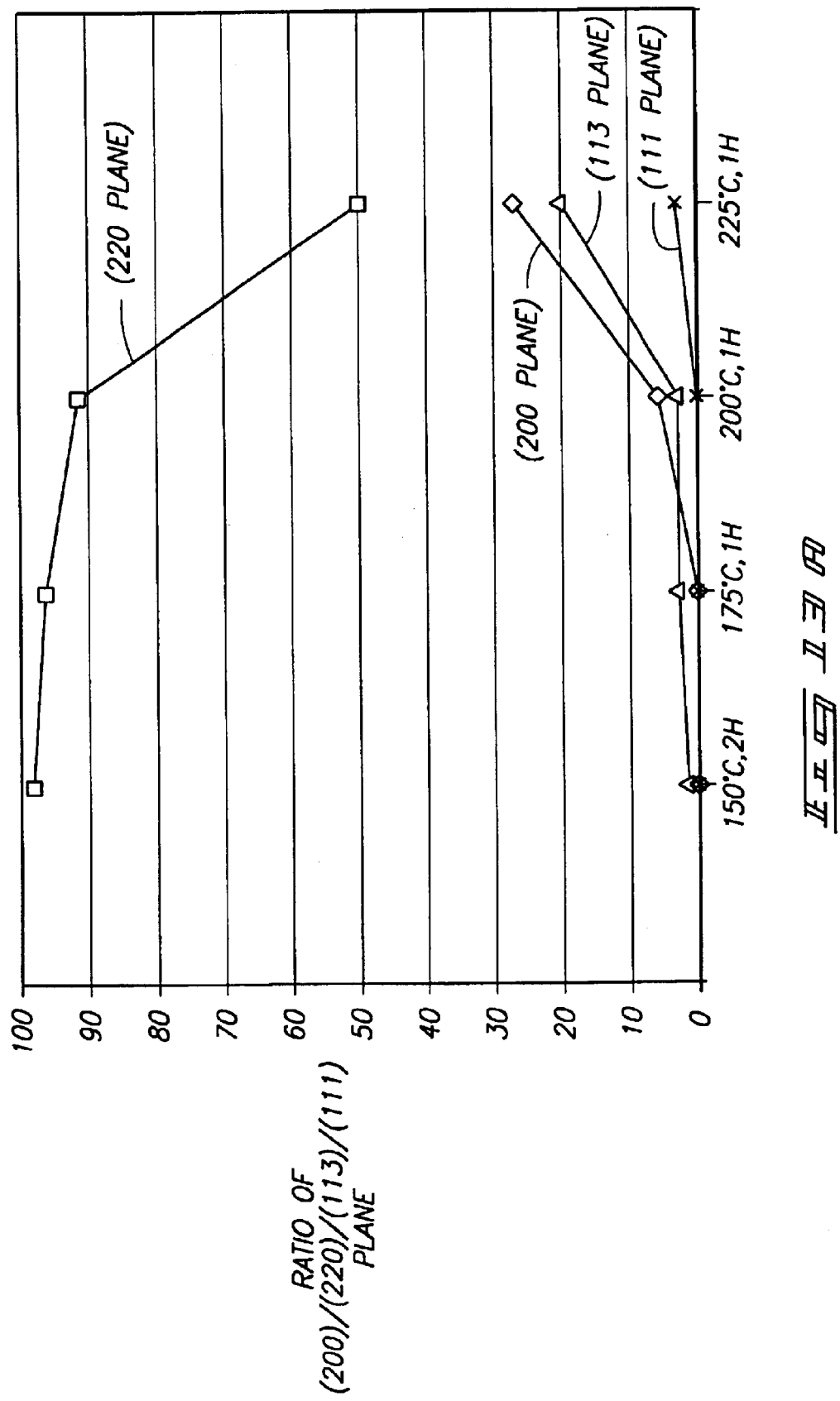
FIGS. 11(a–c) graphically illustrate axial-oriented <220> texture after ECAE and 75% cross-rolling along 8 directions located at 22.5° from each other, with (a) showing a <220> pole figure; (b) showing a <111> pole figure; and (c) showing a <001> inverse pole figure. The average grain size is about 0.5 micron.
Figure 11:
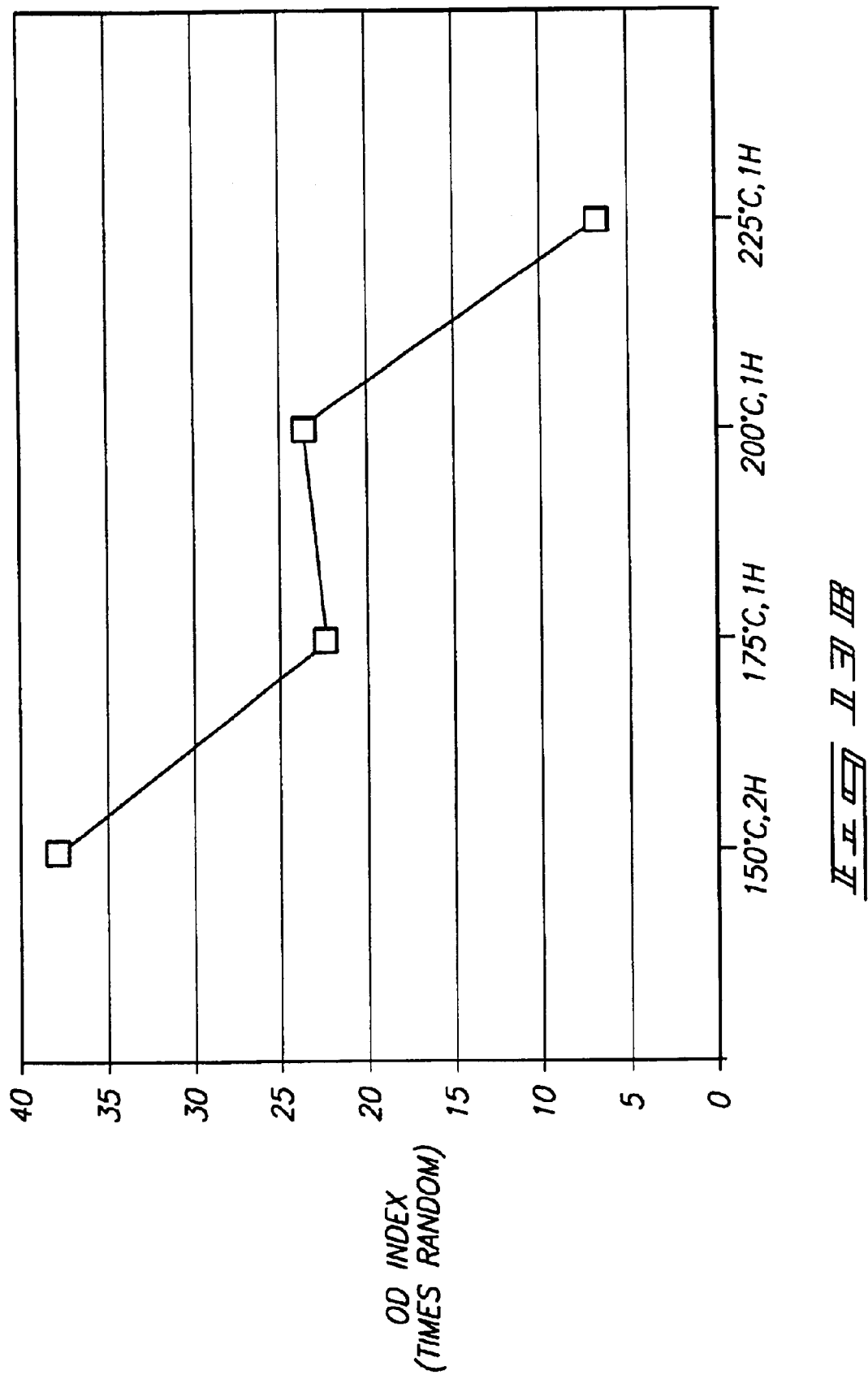
Figure 11:
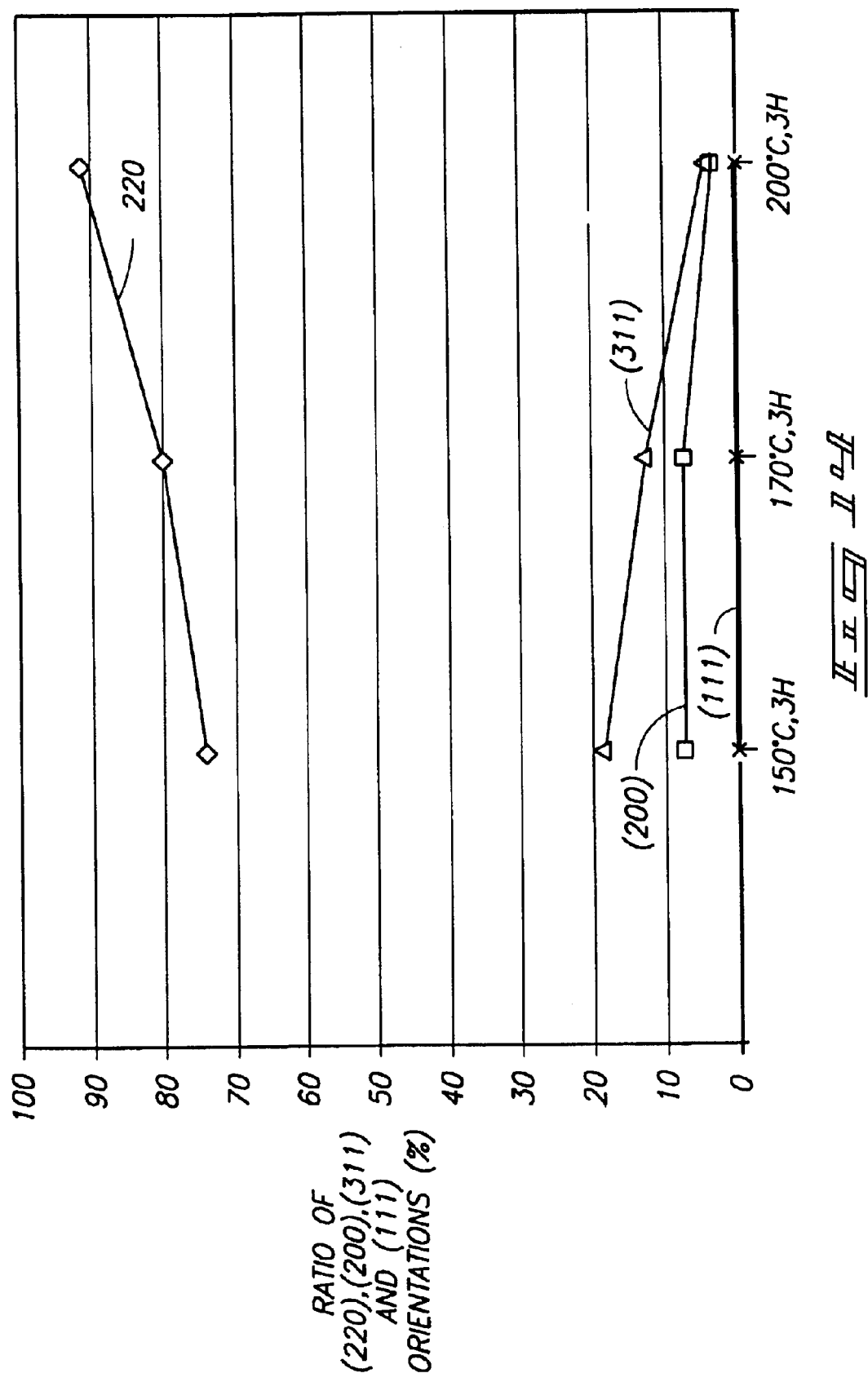

FIG. 11 illustrates exemplary data obtained from billets comprising Al and 0.5% Cu after ECAE and subsequent 75% reduction cross-rolling along 8 directions located at 22.5° from each other. A strong <220>-oriented texture is present, with a <220> ratio of 89%. The <220> and <111> pole figures exhibit ring patterns characteristic of axial-oriented textures (compare FIG. 11(*a*) to FIG. 5(*g*), and note that FIG. 5(*g*) illustrates axial-oriented texture obtained by forging under similar processing conditions to the cross-rolling conditions that generated the texture of FIG. 11(*a*); i.e. around 75% total reduction and warm processing).

The processing of FIGS. 2, 3 and 4 ultimately forms <220>-oriented texture in a material after the texture of the material is randomized by ECAE. The embodiments of FIGS. 2, 3 and 4 can be combined by, for example, combining a forging process (such as the process of FIG. 2), with a cross-rolling process (such as one or both of the process of FIGS. 3 and 4). It is noted that if a process producing a planar orientation of <220> texture is combined with a process producing an axial orientation of <220> texture, the last process in a processing sequence can determine the ultimate orientation of the <220> texture. Thus if a forging process which produces an axial orientation of a <220> texture is combined with a cross-rolling process that produces a planar orientation of a <220> texture, the final texture can have an axial orientation of the <220> texture if the forging process is last in a processing sequence.

After the <220> texture is formed in a material by one or more of the above-described processes, the material can be subjected to annealing to either stabilize or increase grain size within the material, and/or to stabilize or strengthen a texture of the material. Additionally, intermediate annealing can conducted between one or more of the cross-rolling steps described with reference to FIGS. 3 and 4. Two types of annealing that can be utilized are recovery annealing and recrystallization annealing.

Recovery annealing can maintain the ultrafine ECAE grain size, and yet enhance the strength of an axial-oriented or planar-oriented <220> texture. Recovery annealing is preferably post-deformation annealing which occurs after cross-rolling and/or forging have induced a <220> texture. Although recovery annealing is preferably conducted after all cross-rolling and/or forging treatments of a material are complete, it is to be understood that there can be some advantages to also or alternatively performing intermediate recovery annealing between cross-rolling and/or forging passes.

Recovery annealing is preferably conducted under conditions of time and temperature below those of static recrystallization of a treated material, with particular conditions varying depending on the particular material being processed. Exemplary recovery annealing conditions include exposing a material to a temperature of at least about 150° C. for a time of at least about 1 hour. Recovery annealing can strengthen textures, and can accordingly strengthen <220>-orientation within textures. Possible mechanisms by which recovery annealing can strengthen textures include cleaning grain interior regions, removing dislocations, and removing internal stresses without further grain growth or change in grain orientations. Examples of post-deformation recovery annealing effects are displayed in FIGS. 5(*b, d, f,* and *h*), FIG. 6 (after ECAE+forging of a material comprising Al and 0.5% Cu), FIG. 8(*b, d, f,* and *h*), FIG. 9(*a,* and *b*), FIG. 12(*a, b,* and *c*), FIG. 13 (after ECAE+cross-rolling along 2 directions of a material comprising Al and 0.5% Cu), and FIG. 14 (ECAE+cross-rolling along 2 directions of a material comprising Al, 0.2% Si, and 0.5% Cu).

In all investigated cases, annealing at 100° C. for 1 hour has no obvious influence on the characteristics of a tested material (FIGS. 6, and 9). In contrast, after ECAE and forging at 150° C. of material comprising Al and 0.5% Cu, annealing at 175° C. for 1 hour enhanced the <220> texture strength in all investigated cases (FIGS. 5*b,* 5*d,* 5*f,* and 5*h*) and FIG. 6). Specifically, it is found that <220> ratios are increased to ranges of between 76% and 90%. Also, after ECAE and cross-rolling along two directions of a material comprising Al and 0.5% Cu, annealing at 150° C. for 1 hour exerts a large influence on texture evolution. This is found to occur especially at reductions of 75% for 8 passes (FIG. 8*d*) and reductions of 90% for 12 passes (FIGS. 8*f* and 8*h*). The OD index (FIG. 9*b*) is increased by a factor of two, and very strong <220> texture with very high <220> ratios of 91% and 97% are present at 75% and 90% reduction, respectively (FIG. 9(*a*)). The strong textures are found to remain relatively stable. For example, in the case of 90% reduction of a material comprising Al and 0.5% Cu (FIGS. 12, 13), more stringent annealing at 150° C. for 2 hours (FIG. 12a), 175° C. for 1 hour (FIG. 12b), or 200° C. for 1 hour (FIG. 12c) are found to provide very strong <220> texture with a <220> ratio of 98%, 96% and 91% (FIG. 13a), and a OD index of 37 times random, 23 times random, and 22 times random, respectively (FIG. 13b).

FIG. 14 illustrates that a relatively thermally stable material comprising Al with 0.2% Si and 0.5% Cu has a similar behavior to that discussed above for the material comprising Al with 0.5% Cu. Specifically, FIG. 14 illustrates data obtained for the material comprising Al with 0.2% Si and 0.5% Cu after annealing at 150° C. for 3 hours, 175° C. for 3 hours, and 200° C. for 3 hours. Also, it is found that the ECAE sub-micron grain size of around 0.5 micron remains stable after the annealing of either a material comprising Al with 0.5% Cu or a material comprising Al with 0.2% Si and 0.5% Cu.

The second type of annealing indicated above that can be utilized for treating materials produced by the processing of FIGS. 2, 3 and 4 is recrystallization annealing. Recrystallization annealing can be utilized to maintain a dominant <220> axial-oriented or planar-oriented texture, and to produce a grain size between 5 and 30 microns if the recrystallization annealing is conducted at conditions of time and temperature that allow for static recrystallization. Recrystallization annealing is preferably performed at the first stage of static recrystallization, and before any consequent grain growth. For example, FIG. 12(d) shows that a material comprising aluminum and 0.5% copper has a texture which remains close to <220> after full static recrystallization at 225° C. for 1 hour. Further, FIG. 13 shows that a medium <220> texture is present with a <220> ratio of 50% (FIG. 13(a)) and an OD index of 7 times random (FIG. 13(b)). The grain size is about 5 microns for the material described with reference to FIG. 13.

FIG. 15 illustrates a cross-sectional view of a PVD target 100 which can be produced in accordance with methodology of the present invention. Target 100 comprises a sputtering surface 102, and a back surface 104 in opposing relation to sputtering surface 102. Also, target 100 comprises a thickness between surfaces 102 and 104. It is to be understood that target 100 is an exemplary target, and that targets can be produced in other shapes besides that of target 100. A portion 106 of target 100 is marked as being above a dashed line, and is defined to be a portion of target 100 that will ultimately be removed during subsequent sputtering processes. Preferably, target 100 comprises a strong <220>-oriented crystallographic texture across sputtering surface 102 and throughout portion 106. Target 100 can comprise, for example, a strong <220>-oriented texture throughout its entirety, and specifically throughout the thickness between and including surfaces 102 and 104. A "strong" <220> texture (or strong <220>-oriented texture) is defined as a texture comprising a ratio of the <220> crystallographic orientation to all other orientations of a f.c.c. unit cell of at least about 75%, and can comprise, for example such ratio of at least about 80%, at least about 85% or at least about 90%. The <220> orientation of the texture can be either an axial orientation or a planar orientation. In some embodiments, a "predominate" <220> texture is referred to instead of a "strong" <220> texture. A predominate <220> texture (or predominate <220>-oriented texture) is defined as a texture comprising a ratio of the <220> crystallographic orientation to all other orientations of a f.c.c. unit cell of at least 50%.

Methods of the present invention can form target 100 with small and uniform grain sizes. An average grain size across sputtering surface 102, and preferably throughout portion 106, is preferably less than about 30 microns, and can be less than 1 micron. In particular embodiments, the average grain size throughout an entirety of the thickness of target 100 is less than about 30 microns, and can be, for example, less than 1 micron. Further, substantially all of the grains of sputtering surface 102, and preferably throughout portion 106, can have a maximum dimension of less than about 30 microns, and preferably less than about 1 micron (with "substantially all" being defined to be greater than about 70%). In some embodiments, greater than 99% of the grains of sputtering surface 102, and preferably throughout portion 106, can have a maximum dimension of less than about 30 microns, and preferably less than about 1 micron. In particular embodiments, substantially all of the grains throughout an entirety of the thickness of target 100 can have a maximum dimension of less than about 30 microns, and can be, for example, less than 1 micron in maximum dimension; and in yet other embodiments at least 99% of the grains throughout an entirety of the thickness of target 100 can have a maximum dimension of less than about 30 microns, and can be, for example, less than 1 micron in maximum dimension.

The target 100 can be formed from a cast material, and yet comprise substantially no voids, pores or other casting defects if it is treated by ECAE, either alone or in combination with one or more of solutionizing, homogenizing and aging. There will preferably be no casting defects proximate surface 102 (with the term "proximate" referring to a region near and including surface 102 that can impact sputtering of material from surface 102), and also there will preferably be no casting defects within region 106. In particular embodiments, there can be no casting defects throughout the thickness of target 100. Additionally, if there are any precipitates present in the material of target 100, such precipitates can all have a maximum dimension of 0.5 micron or less.

In referring to compositions in this disclosure, it is noted that the terminology of a first material with x % of a second material is intended to encompass compositions comprising the first and second materials, consisting essentially of the first and second materials, or consisting of the first and second materials. Accordingly, references to compositions comprising Al with 0.5% Cu encompass compositions comprising Al and Cu, consisting essentially of Al and Cu, or consisting of Al and Cu. Similarly, references to compositions comprising Al with 1% Si and 0.5% Cu encompass compositions comprising Al, Si and Cu; consisting essentially of Al, Si and Cu; or consisting of Al, Si and Cu.

What is claimed is:

1. A physical vapor deposition target comprising a material with a face centered cubic unit cell, having a sputtering surface, and formed by a process comprising:

casting;

equal channel angular extrusion; and after the equal channel angular extrusion, modifying crystallographic texture orientation by additional processing comprising at least one of cross-rolling and forging to enhance one of axial-oriented <220> and planar-oriented <220> crystallographic texture; the target having a (220) plane intensity contribution of at least about 60% relative to a total intensity contributed by (220), (200), (111) and (113) planes, a predominate <220> crystallographic texture across the sputtering surface, and an average grain size across the sputtering surface of less than or equal to about 30 microns.

2. The physical vapor deposition target of claim 1 wherein the average grain size across the sputtering surface is less than or equal to 1 micron.

3. The physical vapor deposition target of claim 1 further comprising substantially no pores or voids proximate the sputtering surface.

4. The physical vapor deposition target of claim 1 wherein the predominate <220> crystallographic texture is a strong <220> crystallographic texture.

5. The physical vapor deposition target of claim 1 comprising a ratio of the <220> crystallographic orientation to all other orientations of the face centered cubic unit cell of at least about 80%.

6. The physical vapor deposition target of claim 1 comprising a ratio of the <220> crystallographic orientation to all other orientations of the face centered cubic unit cell of at least about 90%.

7. The physical vapor deposition target of claim 1 wherein substantially all of the grain sizes across the sputtering surface are less than about 30 microns.

8. The physical vapor deposition target of claim 1 wherein substantially all of the grain sizes across the sputtering surface are less than 1 micron.

9. The physical vapor deposition target of claim 1 wherein the additional processing comprises forging and the <220> texture comprises predominately axial <220> orientations.

10. The physical vapor deposition target of claim 1 wherein the additional processing comprises cross-rolling and the <220> texture comprises predominately planar <220> orientations.

11. The physical vapor deposition target of claim 1 comprising at least one element selected from the group consisting of aluminum, copper, silver, gold, nickel, brass, cerium, cobalt, calcium, iron, lead, palladium, platinum, rhodium, strontium, ytterbium, and thorium.

12. The physical vapor deposition target of claim 1 comprising at least one element selected from the group consisting of aluminum, copper, gold, nickel, and platinum.

13. The physical vapor deposition target of claim 1 wherein any precipitates present in the target have a maximum dimension of 0.5 micron.

14. A physical vapor deposition target comprising:
  a copper material with a face centered cubic unit cell;
  a (220) plane intensity of at least 60% based upon a total intensity of (220), (200), (111) and (113) planes;
  a predominate <220> crystallographic texture across a sputtering surface; and
  an average grain size across the sputtering surface of less than or equal to about 30 microns, wherein any second-phase precipitates present in the target have a maximum dimension of 0.5 micron.

15. The physical vapor deposition target of claim 14 comprising at least one element selected from the group consisting of aluminum, silver, and gold.

16. The physical vapor deposition target of claim 15 comprising silver.

17. The physical vapor deposition target of claim 15 comprising gold.

18. The physical vapor deposition target of claim 15 comprising aluminum.

19. The physical vapor deposition target of claim 14 wherein the average grain size across the sputtering surface is less than or equal to 1 micron.

20. The physical vapor deposition target of claim 14 further comprising substantially no pores or voids proximate the sputtering surface.

21. The physical vapor deposition target of claim 14 wherein the predominate <220> crystallographic texture is a strong <220> crystallographic texture.

22. The physical vapor deposition target of claim 14 comprising a ratio of the <220>-crystallographic orientation to all other orientations of the face centered cubic unit cell of at least about 80%.

23. The physical vapor deposition target of claim 14 comprising a ratio of the <220> crystallographic orientation to all other orientations of the face centered cubic unit cell of at least about 90%.

24. The physical vapor deposition target of claim 14 wherein substantially all of the grain sizes across the sputtering surface are less than about 30 microns.

25. The physical vapor deposition target of claim 14 wherein substantially all of the grain sizes across the sputtering surface are less than 1 micron.

26. The physical vapor deposition target of claim 14 wherein the <220> texture comprises predominately axial <220> orientations.

27. The physical vapor deposition target of claim 14 wherein the <220> texture comprises predominately planar <220> orientations.

28. A physical vapor deposition target comprising a material with a face centered cubic unit cell, the target comprising:
  a (220) plane intensity of at least about 60% based upon a total intensity of (220), (200), (111) and (113) planes; and
  at least one element selected from the group consisting of aluminum, copper, silver, gold, nickel, brass, cerium, cobalt, calcium, iron, lead, palladium, platinum, rhodium, strontium, ytterbium, and thorium.

* * * * *

UNITED STATES PATENT AND TRADEMARK OFFICE
CERTIFICATE OF CORRECTION

PATENT NO. : 6,946,039 B1  
APPLICATION NO. : 09/705101  
DATED : September 20, 2005  
INVENTOR(S) : Segal et al.

It is certified that error appears in the above-identified patent and that said Letters Patent is hereby corrected as shown below:

Item (56) References Cited, Other Publications – Insert "R.Z. Valiev et al., "Plastic deformation of alloys with submicron-grained structure", Materials Science and Engineering, A137 (1991) pp. 35-40.

Column 3, line 47 – Replace "comprise" with --comprises--.

Column 4, line 40 – Replace "a an b" with --a and b--.

Column 12, line 12 – Replace "insure" with --ensure--.

Column 14, line 16 – After "can" insert --be--.

Column 14, line 56 – Replace "5h)" with --5h--.

Signed and Sealed this

Twenty-second Day of August, 2006

JON W. DUDAS  
*Director of the United States Patent and Trademark Office*